(12) United States Patent
Sanjoh

(10) Patent No.: US 6,258,331 B1
(45) Date of Patent: Jul. 10, 2001

(54) APPARATUS FOR GROWING CRYSTALS

(75) Inventor: Akira Sanjoh, Nara (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/530,217

(22) PCT Filed: Oct. 9, 1998

(86) PCT No.: PCT/JP98/04573

§ 371 Date: Apr. 26, 2000

§ 102(e) Date: Apr. 26, 2000

(87) PCT Pub. No.: WO99/23284

PCT Pub. Date: May 14, 1999

(30) Foreign Application Priority Data

Oct. 31, 1997 (JP) .................................... 9-300325

(51) Int. Cl.[7] ................. B01D 9/00; L30B 35/00
(52) U.S. Cl. ................. 422/245.1; 422/253; 117/206
(58) Field of Search ................. 117/68, 70, 206, 117/927; 422/245.1, 253; 204/165

(56) References Cited

U.S. PATENT DOCUMENTS 5,423,287 * 6/1995 Usami et al. .................. 117/206

FOREIGN PATENT DOCUMENTS

| | | |
|---|---|---|
| 821987A1 * | 2/1998 | (EP) . |
| 0913507 A1 | 5/1999 | (EP) . |
| 4-182398 | 6/1992 | (JP) . |
| 6-321700 | 11/1994 | (JP) . |
| 8-294601 | 11/1996 | (JP) . |
| WO 9626781 * | 9/1996 | (WO) . |

OTHER PUBLICATIONS

U.S. application No. 09/225,706 filed Jan. 6, 1999.
F. Rosenberger, Journal of Crystal Growth 76 (1986): 618–636 "Inorganic and Protein Crystal Growth—Similarities and Differences".

* cited by examiner

Primary Examiner—Benjamin L. Utech
Assistant Examiner—Matthew Anderson
(74) Attorney, Agent, or Firm—Barnes & Thornburg

(57) ABSTRACT

A simple and economic apparatus for crystal growth effective in crystallization of a biological macromolecule such as protein is provided. The apparatus for crystal growth includes first liquid storage parts and for holding a liquid to be used for crystal growth, passages and for transporting the liquid from the first liquid storage parts and to other places, and a second liquid storage part for receiving the liquid transported by the passages and. The first liquid storage parts and are formed on a substrate formed of a general-purpose material such as glass. The second liquid storage part is formed on a doped silicon substrate. Crystal growth occurs on the surface of the silicon substrate having a certain electric state.

13 Claims, 32 Drawing Sheets

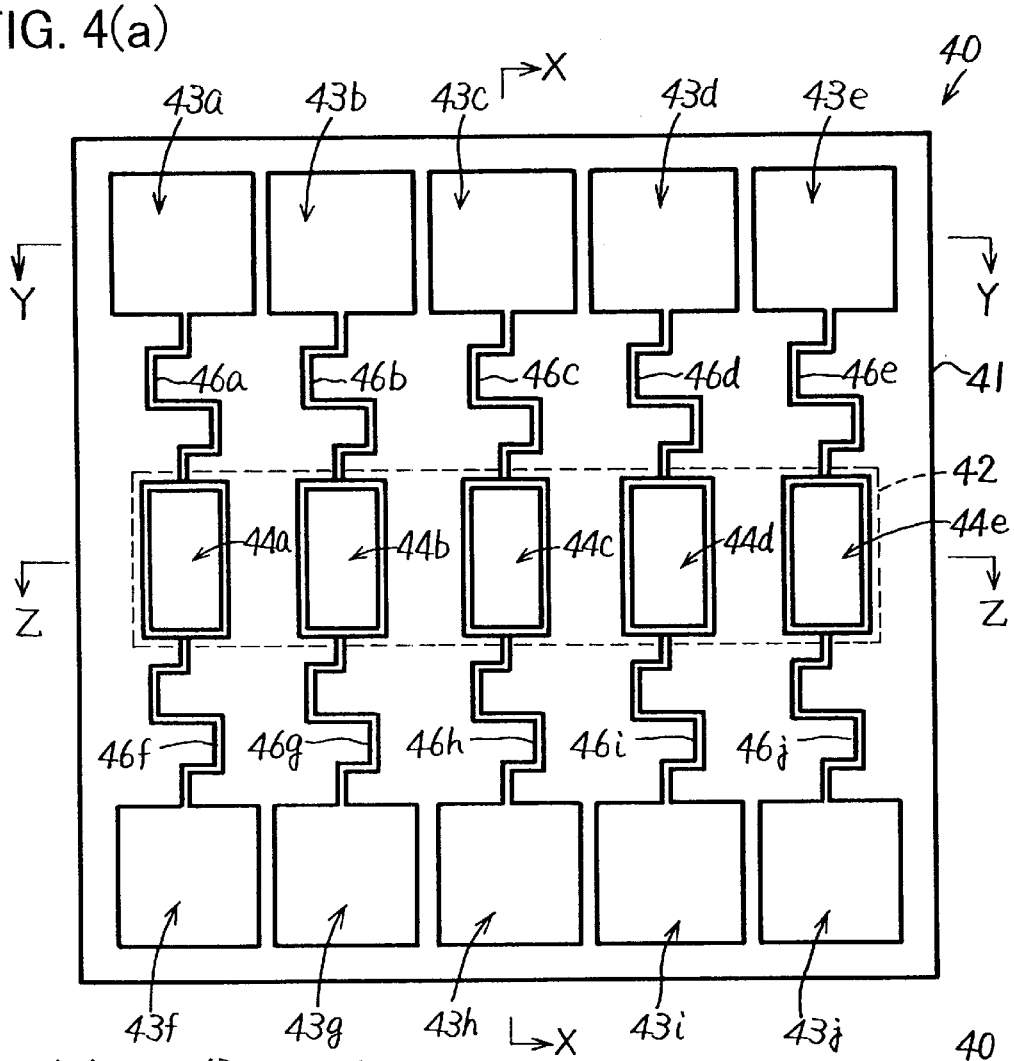
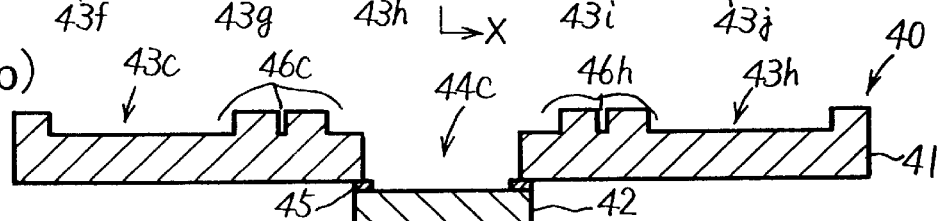
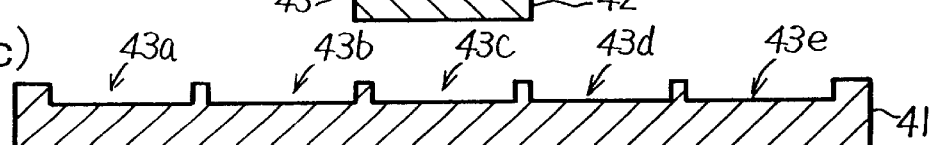
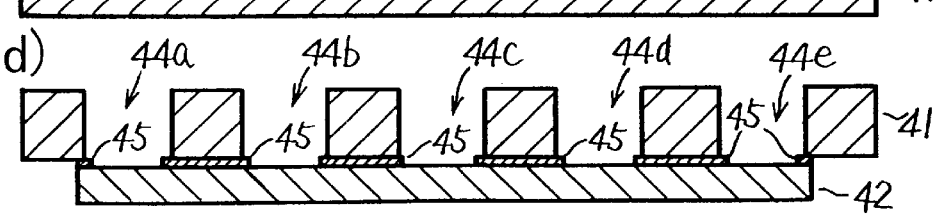

FIG. 15(a)
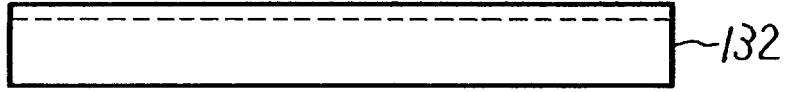
FIG. 15(c)
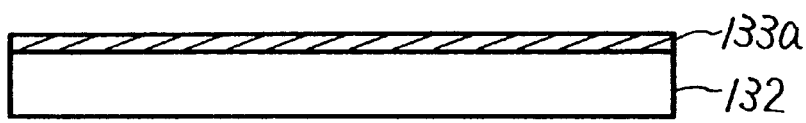
FIG. 15(d)
FIG. 15(e)
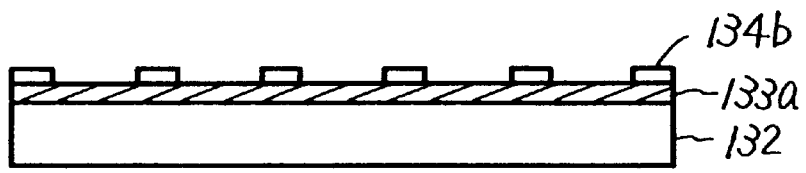
FIG. 15(f)
FIG. 15(g)

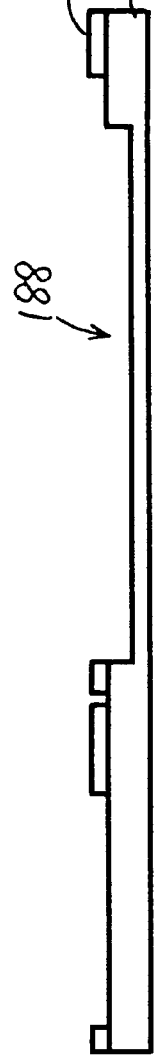
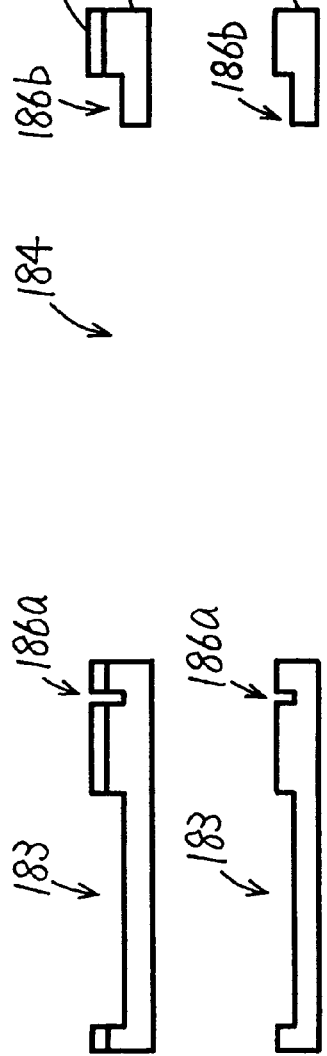

FIG. 27
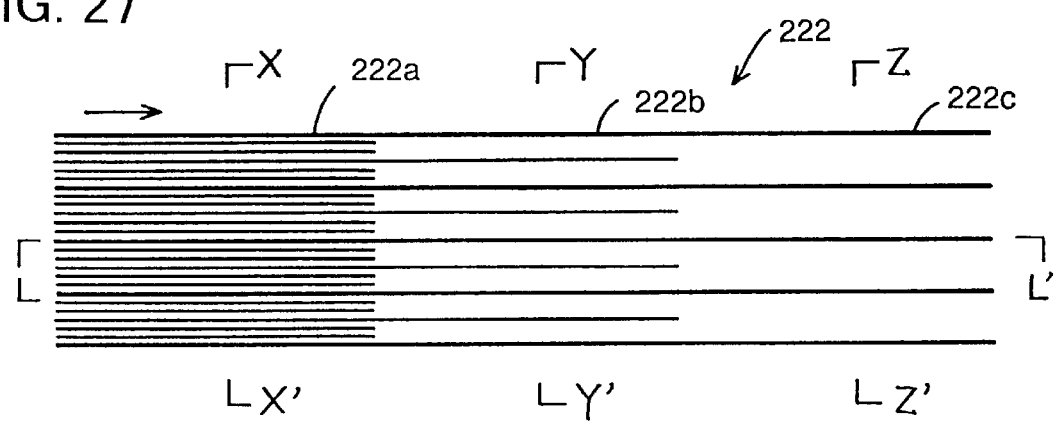
FIG. 28
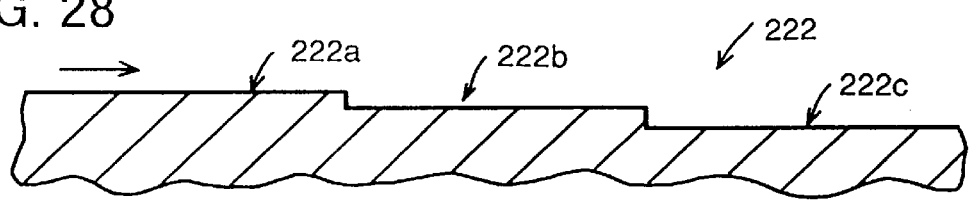
FIG. 29(a)  FIG. 29(b)  FIG. 29(c)
X-X'        Y-Y'        Z-Z'
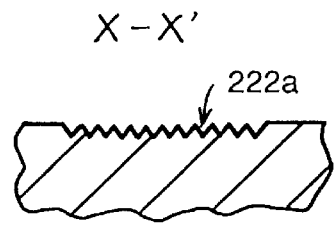 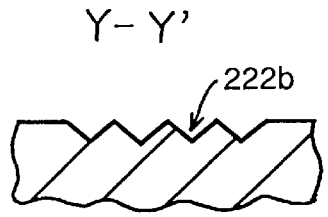 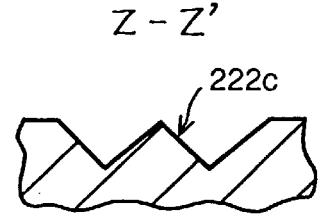

APPARATUS FOR GROWING CRYSTALS

This application is a 371 of PCT/JP98/04573 filed Oct. 9, 1998.

TECHNICAL FIELD

The present invention relates to an apparatus for crystallization of macromolecules. Particularly, the present invention relates to the technique of providing an apparatus for crystallization of various biological macromolecules such as proteins and nucleic acids by the combination of a material such a semiconductor substrate whose valence electrons are controlled with a substrate of another material such as glass.

BACKGROUND ART

For the understanding of specific properties and functions in various types of biological macromolecules such as protein and complexes thereof, detailed steric structures thereof are indispensable information. From the basic biochemical standpoint, for example, information on the three-dimensional structure of protein or the like becomes the basis to understand the mechanism of functional expression in the biochemistry system with an enzyme or hormone. Particularly in the fields of pharmacy, genetic engineering, and chemical engineering among the industrial circles, the three-dimensional structure provides information indispensable for rational molecular design to facilitate drug designing, protein engineering, biochemical synthesis and the like.

As to the method of obtaining a three-dimensional steric structure of biological macromolecules at the atomic level, X-ray crystal structural analysis is the most cogent and precise means at present. The speed for analysis is significantly improving by virtue of the drastic increasing in the processing speed of computers in addition to reduction in the time for measurement and improvement in the measuring accuracy resulting from the recent hardware improvement of X-ray light sources and analyzers. It is expected that the three-dimensional structure will be clarified mainly depending upon this method.

In order to determine the three-dimensional structure of biological macromolecules by X-ray crystal structural analysis, it is essential to crystallize the target substance after extraction and purification. At present, there is neither technique nor apparatus that can be applied to every substance to achieve crystallization. In a conventional crystallization process, trial and error has been repeated relying on intuition and experience. In order to obtain a crystal of a biological macromolecule, the process for crystal growth has been required great numbers of experimental conditions, and it has been a serious bottleneck in the field of X-ray crystallographic analysis.

In a conventional process for crystallization of a biological macromolecule such as protein, a treatment for eliminating a solvent from an aqueous or non-aqueous solution containing the macromolecule is basically carried out, so that the resulting supersaturated state can reduce the solubility, leading to crystal growth. That is similar to the crystal growth process for low molecular weight compounds such as inorganic salts. As typical methods thereof, a batch method, dialysis, and diffusion are known. These methods are used depending upon the type, quantity, property, and the like of the sample.

In the batch method, a precipitant for eliminating the water of hydration is directly added to a solution containing a biological macromolecule to reduce its solubility, leading to its conversion into a solid phase. In this method, solid ammonium sulfate, for example, is often used. This method is disadvantageous in that a large amount of sample solution is required, fine adjustment of the salt concentration and pH is difficult, skill is required in operation, and reproducibility is low. In the dialysis method that is a improved one to eliminate some faults of the batch method, a solution including a biological macromolecule is filled in a sealed dialytic tube, and the pH or the like of the dialytic tube surrounding liquid such as a buffer solution is altered to induce crystallization. This method allows adjustment of the salt concentration and difference in pH of the inner and outer solutions at an arbitrary speed to facilitate the research for the crystallization conditions. One of the diffusion methods such as a gas-liquid phase diffusion method is shown in FIG. 39. A droplet 397 of a sample solution is placed on sample holders 393a and 393b. The droplet 397 and precipitant solutions 394a and 394b are retained in containers 391a and 391b, respectively, sealed by a cap 392, whereby the volatile components of the droplet and the precipitant solutions are vaporized into equilibrium. More preferable conditions can be obtained using different precipitants in a plurality of containers as shown in the drawing. In a liquid-liquid phase diffusion method, a droplet 407 of the mother liquor including the target substance and a droplet 404 of a precipitant are placed approximately 5 mm apart on a substrate 401, as shown in FIGS. 40(a) and 40(b). A thin liquid channel 406 is formed between the droplets by the tip of a needle or the like. Mutual diffusion through the channel 406 promotes crystallization. These diffusion methods are advantageous over the batch method in that the required amount of solution is extremely small.

However, there are still various problems as described above in the crystallization process of biological macromolecules such as proteins.

Many biological macromolecules do not have good crystallinity, so that a single crystal of them cannot be easily formed in a large size. This is probably because of the fact that the biological macromolecules generally having a great molecular weight are highly susceptible to gravity, causing convection in the solution (cf, F. Rosenberger, J. Cryst. Growth, 76, 618 (1986)). The small crystal nucleus of the biological macromolecules precipitates by its own weight, whereby convection occurs around the molecules or the crystal nucleus in the solution. The reduction in the concentration of the molecules also causes local convection at the surface of the grown crystal in the solution. The generated convection moves the grown crystal in the solution. Particularly around the crystal, the molecular supply layer is significantly reduced by the convection in the solution. Accordingly, the crystal growth rate is reduced, and anisotropic growth occurs at the crystal plane, so that crystallization is inhibited.

The crystal of biological macromolecules may contain a larger amount ($\geq 50\%$ by volume) of solvent (mainly water from mother liquor) as compared with the crystal of other substances. The solvent is disorderly and readily movable in the intermolecular clearances of the crystal. Though the size of the molecules is relatively large, there is little packing contact between the molecules in a wide range of the crystal, and the weak bond by the van der Waals force between the molecules or the hydrogen bond via the water molecule simply contributes to the contact. These are also related to the inhibited crystallization.

The biological macromolecules may be very sensitive to the conditions for crystallization. Although the biological macromoleculars may be stabilized in the solvent by the interaction between the molecular surfaces, the charge distribution on the molecular surface and particularly the conformation of amino acids around the molecular surface may significantly vary with the environmental factor such as pH, ion strength, and temperature of the solution, the type and dielectric constant of the buffer solution, and the like. Therefore, the crystallization is a multi-parameter process with a complicated combination of various conditions. Thus, a universal crystallization technique that can be effective for any substance is under development. Especially, crystallization of hydrophobic proteins that may have more biochemical interest as compared with water-soluble proteins is very difficult. Only a few cases have been successful in crystallization of hydrophobic proteins and the analysis thereof with high resolution.

The resulting amount of biological macromolecules may often be quite small. For example, when a protein such as an enzyme is extracted from cells or the like and purified, the original content thereof may often be small and therefore the finally obtained sample for crystallization may be extremely small. In general, crystallization of biological macromolecules may require their concentration to be about 50 mg/ml in the solution. Therefore, each of repeated experiments (screening) under various conditions for crystallization must be carried out with a minimized amount of solution.

As mentioned above, the diffusion method does not require a great amount of sample. However, in order to obtain a crystal of good quality, the optimum conditions for crystallization must be obtained by altering the concentration of salt in the precipitant, pH or the like over a wide range. In such a case, trial and error is always involved for the adjustment of the conditions. In addition, the material such as a glass substrate on which the droplet of the sample is formed may often induce an undesired large amount of crystal nuclei. To prevent this event, the material surface should be processed by polishing, water-repellent finish or the like.

Although crystallization of biological macromolecules such as proteins and complexes thereof is an important process in science and industry, the conventional process for crystallization has always involved trial and error. The process for crystallization is a greatest barrier against the X-ray crystal structural analysis. Accordingly, desired is a crystallization technique applicable to any molecule based on a universal principle of crystallization.

Japanese Patent Laying-Open No. 4-182398 discloses an improved diffusion method. In this method, a biological macromolecular solution and a crystallization agent are allowed to stand in contact with each other at their surfaces, and then the container holding the biological macromolecule solution is divided into some parts by insertion of partitions, after the crystallization agent is allowed to diffuse into the biological macromolecular solution to a certain extent. From the obtained parts, a part or parts, which have more preferable conditions for crystallization, are selected. Japanese Patent Laying-Open No. 6-321700 discloses a method of preventing convection in the solution for crystallization. According to this method, acrylic amide, agarose or the like is added to the buffer in which the substance to be crystallized is dissolved, so that the substance is fixed in the resulting gel. The target substance is set in a supersaturated state in the gel by cooling, heating, or diffusing the precipitant introduced into the gel, for crystallization.

Over the above-mentioned conventional art, the inventor has developed a unique technique for crystallization as disclosed in Japanese Patent Laying-Open No. 8-294601. According to the developed method, crystallization of biological macromolecules such as proteins can be controlled on the surface of a solid-state component having the electrical state controlled under the control of the valence electrons, for example, on the surface of a silicon substrate doped with a certain type of impurity in a given concentration.

SUMMARY OF THE INVENTION

An object of the present invention is to provide a technique for solving the disadvantages of the conventional crystallization process that has been carried out by repeating trial and error, and that could not be universally effective to any substance due to the variety as described above.

Specifically, an object of the present invention is to provide an apparatus that can effect crystallization simply and conveniently applying the aforementioned crystallization technique of the inventor.

Another object of the present invention is to provide an apparatus that can reduce convection in a solution caused by influence of gravity and control formation of a nucleus for crystallization of various biological macromolecules and biological tissues mainly composed of biological macromolecules.

A further object of the present invention is to provide an apparatus that can suppress or control generation of a large amount of micro crystals and grow a large crystal that allows X-ray structural analysis.

Still another object of the present invention is to provide an apparatus that allows growth of a crystal with a small amount of biological macromolecular solution.

According to the present invention, an apparatus for growing a crystal of a macromolecule contained in a solution is provided. This apparatus includes a first liquid storage part for holding a liquid to be used for crystal growth, a passage for transporting the liquid from the first liquid storage part to another place, and a second liquid storage part for receiving the liquid transported by the passage. The first liquid storage part, or both the first liquid storage part and the passage are formed on a first material. The second liquid storage part is formed on a second material whose valence electrons are controlled so that the concentration of holes or electrons in a surface part can be controlled in response to the environment of the solution containing the macromolecule. The first and second materials differ from each other. In the apparatus of the present invention, the first liquid storage part and the passage may be formed on a first substrate formed of the first material. The second liquid storage part may be formed on a second substrate having a layer formed of the second material. The first substrate and the second substrate may be so combined that the liquid held in the first liquid storage part can be transported to the second liquid storage part through the passage. It is preferable to compose the apparatus of the present invention by combining at least two substrates.

In the apparatus of the present invention with the combination of at least two substrates, the first substrate preferably has a hole into which the liquid held in the first liquid storage part can flow through the passage. By providing the second substrate at the bottom of this hole, the second liquid storage part can be formed by the hole and the second substrate.

In the apparatus of the present invention, it is preferable that the valence electrons are so controlled that crystal nucleus formation and crystal growth of the macromolecule are facilitated at a specific region in the surface of the second material while crystal nucleus formation is suppressed at the remaining region in the surface of the second material.

In the present invention, the second material is preferably an impurity-added semiconductor. The valence electron control can be made by control of the concentration and/or type of the impurity.

In the present invention, the second liquid storage part may be formed on an impurity-added semiconductor substrate or on an impurity-added semiconductor layer formed on an electrically insulative material.

In the present invention, the first material is preferably an electrically insulative material.

Additional features and advantages of the application will become apparent to those skilled in the art upon consideration of the following descriptions.

BRIEF DESCRIPTION OF THE DRAWINGS

FIGS. 4(a), 4(b), 4(c) and 4(d) are a plan view, a sectional view taken along X—X, a sectional view taken along Y—Y and a sectional view taken along Z—Z, respectively, showing another embodiment of the apparatus for crystal growth according to the present invention.

FIGS. 15(a) 15(b), 15(c), 15(d), 15(e), 15(f), and 15(g) are schematic sectional views showing a process of preparing a lower substrate of the apparatus shown in FIGS. 2(a), 2(b), and 2(c).

FIGS. 23(a)–23(b), 23(c), 23(d), 23(e), and 23(f), are schematic sectional views showing a process of preparing an upper substrate of the apparatus shown in FIGS. 20(a)–20(b), and 20(c).

FIG. 27 is a plan view showing an embodiment of the passage formed in the apparatus of the present invention.

FIG. 28 is a sectional view taken along L–L' of the passage of FIG. 27.

FIGS. 29(a), 29(b) and 29(c) are sectional views taken along X-X', Y-Y' and Z-Z', respectively, of the passage shown in FIG. 27.

FIGS. 40(a) and 49(b) are schematic diagrams showing another embodiment of the apparatus used in the conventional method.

DETAILED DESCRIPTION OF THE DRAWINGS

Most biological macromolecules such as proteins may make intermolecular recognition through a geometrically specific structure and electrostatic interaction (electrostatic repulsive force or attraction, or van der Waals force) in a solution. In the intermolecular interaction based on electrostatic energy, any slight difference between spatial charge distributions in the outermost surfaces of the molecules might have a critical effect on the degree of the intermolecular recognition and the easiness of molecular aggregate formation. For the molecules repeating collision while taking Brownian movement in the solution, it should be difficult to form a nucleus that is an aggregate of the molecules having a periodic and regular structure. Even if a crystal nucleus is formed, the molecules aggregating around the nucleus may be loosely bonded to each other, resulting in a product of low crystallinity, where the structures and the charge distributions at the surfaces of the molecules are not identical to each other and has redundancy.

Regarding crystal formation of protein molecules, it has been reported that the initial process of nucleation is important. Yonath et al. have observed the initial crystallization process of a gigantic ribosomal subunit extracted from Bacillus Stearothermophilus with an electron microscope. This report teaches that, in order to facilitate crystallization, the molecules must aggregate taking a two-dimensionally regular structure (mesh, stellate, zigzag lattice or the like) in the initial process (Biochemistry International, Vol. 5, 629–636 (1982)).

It is not sure whether or not this is indispensable to all substances in common. In general, protein molecules may not easily aggregate because of their weak intermolecular interaction and their locally charged surface. However, such molecules may still find some conditions which can arrange them in a two-dimensional manner, leading to formation of a nucleus at the initial stage and subsequent crystallization in an epitaxial manner based on the nucleus.

Figure 1A:
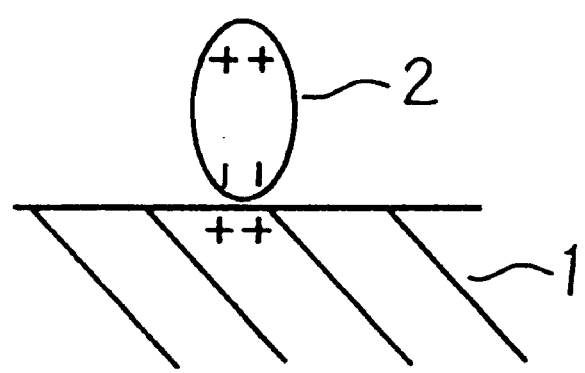
FIGS. 1(a) and 1(b) are schematic diagrams showing crystal growth on the material whose valence electrons are controlled in the apparatus of the present invention.
Figure 1B:
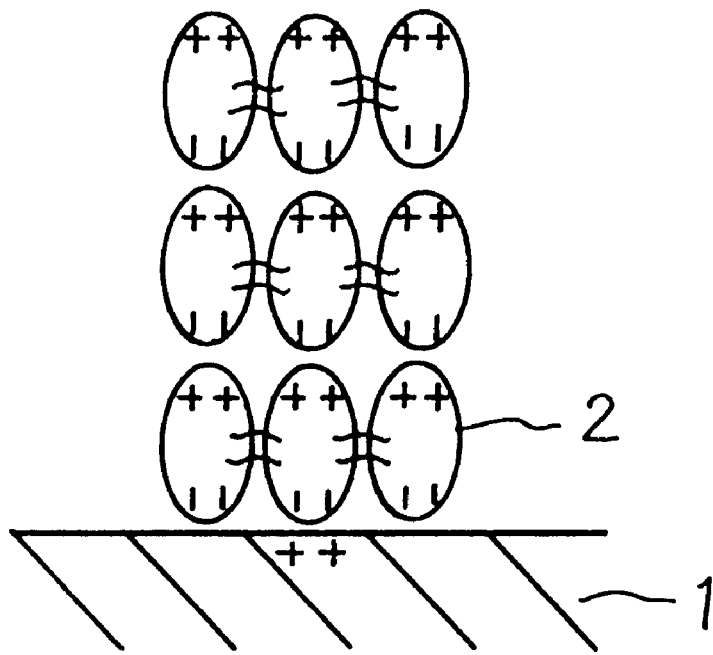

The present invention provides an apparatus comprising a material whose valence electrons are controlled. In order to produce a crystal nucleus stably, the material of the apparatus is contacted with a liquid containing the substance to be crystallized. Due to the valence electron control, the material can control the concentration of electrons or holes from the surface in contact with the liquid toward the inside or within a cross section of the material, whereby the electrical state on the surface of the material can be controlled. FIGS. 1(a) and 1(b) schematically show a manner of crystal growth where a crystal nucleus is fixed on the surface of the material. As shown in FIG. 1(a), a crystal nucleus 2 is fixed by electrostatic action to the surface of a material 1 that is brought into a certain electrical state, due to the valence electron control. As shown in FIG. 1(b), a compound such as protein aggregates on the surface of the material by electrostatic interaction, and formation of a crystal nucleus is facilitated or accelerated, resulting in crystal growth. Thus, the controlled electrical properties of the material surface enable the control of crystallization. For example, the type, amount, arrangement density and the like of the crystal nucleus fixed to the surface of the material can be adjusted by valence electron control, whereby control of crystallization is allowed. The fixation of the formed crystal nucleus to the material surface can prevent the nucleus from minutely moving by convection or the like in the solution. A regular aggregation of the molecules following the formation of the nucleus may lead to an improved crystallinity. Even in the case where the surface charge distribution of the molecules to be crystallized is slightly changed depending on the pH of the solution or denaturation of the molecules, space charges may be induced in the material surface to compensate for the net surface charge of the molecules, so that the formation of the crystal nucleus and the two-dimensional arrangement can be induced easily and preferentially.

According to the present invention, the material whose valence electrons are controlled as described above and another material are combined to provide an apparatus that can present more preferable conditions for crystallization. In this apparatus, a liquid storage part for holding a solution containing a macromolecule to be crystallized is formed on the material whose valence electrons are controlled. On the other material, formed is another storage part for holding a liquid to be used for crystal growth such as a buffer solution, a precipitant, or the like. These two storage parts may be connected by a passage. The passage may be formed on the material whose valence electrons are controlled or on the other material. The liquids for crystallization can move through the passage between at least two liquid storage parts, so that they can be mixed with or diffused into each other to produce more preferable conditions for crystallization. The diffusion of the liquids can be continuously altered spatially and temporally to make fine adjustment of the conditions for crystallization.

The liquid storage part can be provided by working a material, for example, by forming a groove, a hole, or the like in the material. For example, a microfabrication process generally employed in the fabrication of a semiconductor device may be used to form a small dent or hole in a substrate to provide a cell for holding a small amount of sample solution or reagent. A reaction cell, which is a liquid storage part for forming and growing a crystal, can be formed on a substrate comprising a material whose valence electrons are controlled, for example, on an impurity-added semiconductor substrate. A cell for holding a liquid reagent used for crystallization can be formed on a substrate comprising another material, for example, on a glass substrate. The passage can also be formed by the microfabrication process generally employed in the fabrication of a semiconductor device. The passage may be a fine groove obtained by directly working the surface of the substrate, and/or a fine groove obtained by working a film such as an insulative film formed on the substrate. The liquid can move in the groove by capillarity or the difference in pressure within the passage as a driving force. The flow rate of the liquid in the groove can be changed by altering the width, depth and the like of the groove. A stepwise shape between the upstream and the downstream can make a unidirectional flow.

One important feature of the present invention is that the apparatus is composed of the combination of the material whose valence electrons are controlled and another different material. An impurity-added semiconductor substrate such as a silicon substrate is relatively expensive. Such a material often has limitations on workability. According to the present invention, usage of such an expensive and relatively intractable material can be kept minimum, and another economic and highly workable material can be used as much as possible. Specifically, in the apparatus of the present invention, the material whose valence electrons are controlled may be arranged at the part necessary for crystal growth (second liquid storage part) whereas a more economic and highly workable material may be arranged at the remaining region. Such a combination of the materials can provide an apparatus of high working flexibility and low cost.

As the material whose valence electrons are controlled, a semiconductor can preferably be used with the type, concentration, concentration distribution and the like of the impurity selected or controlled. Particularly, a semiconductor crystal such as a doped silicon crystal can be used preferably. As the material whose valence electrons are controlled, other inorganic compounds, organic compounds, polymer compounds, and combinations thereof whose charge distribution is controlled can be used. As the other material used in combination with the material whose valence electrons are controlled, a general-purpose material can be used. For example, glass, resin such as polycarbonate, metal such as stainless steel or the like can be used as the other material. The other material is preferably an electrically insulative material such as glass or resin. Glass is particularly preferable from the standpoint of heat resistance, endurance, strength, workability, and the like. In combining these different materials, any bonding method such as welding or adhesion can be used. In order to couple a glass substrate to a semiconductor substrate, an anodic bonding method is preferably employed. In the anodic bonding method, a high voltage is applied across the overlaid materials to fuse the interface for bonding. Although these substrates are heated to a high temperature in the anodic bonding method, the glass substrate having a relatively low thermal expansion coefficient is not easily deformed. Specific embodiments of the apparatus using plural types of materials will be described hereinafter.

Figure 2A:
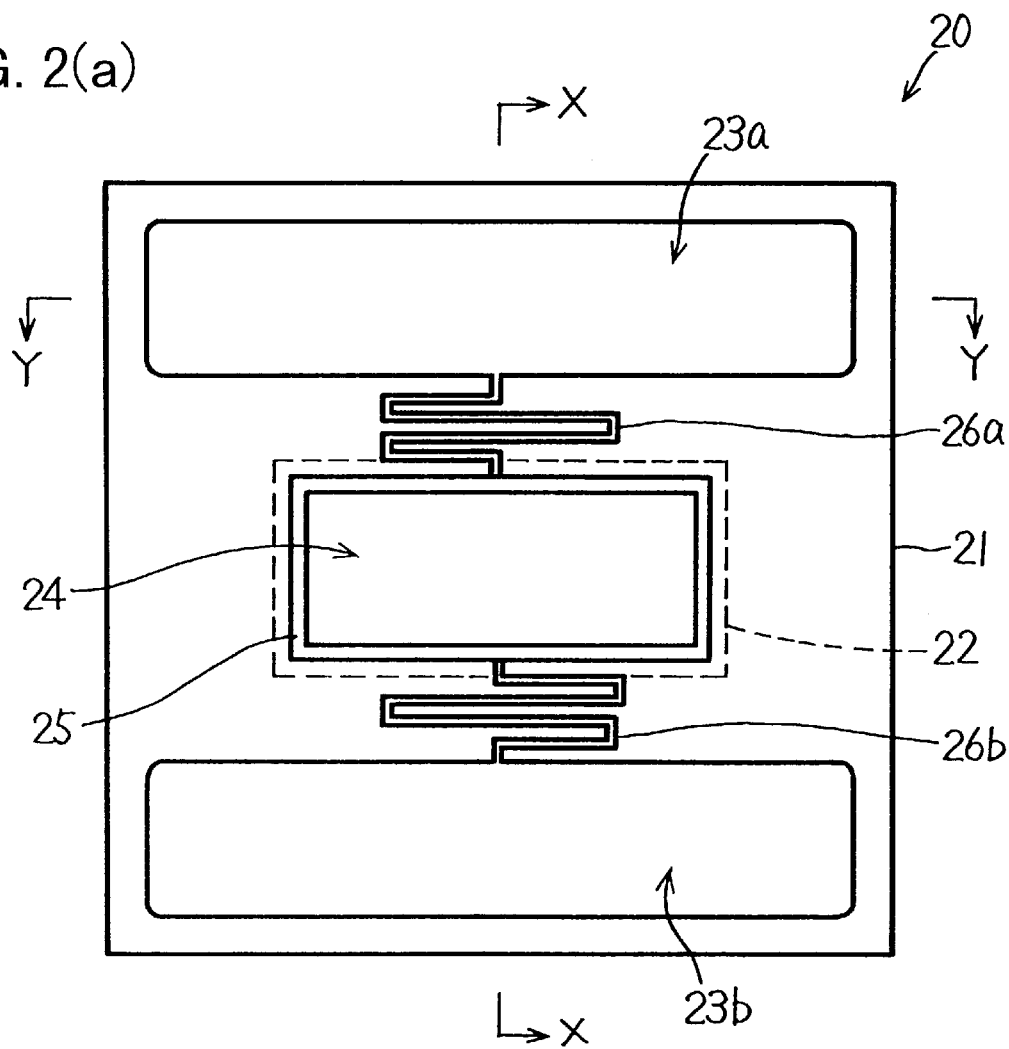
FIGS. 2(a), 2(b) and 2(c) are a plan view, a sectional view taken along X—X, and a sectional view taken along Y—Y, respectively, for an embodiment of the apparatus for crystal growth according to the present invention.
Figure 2B:
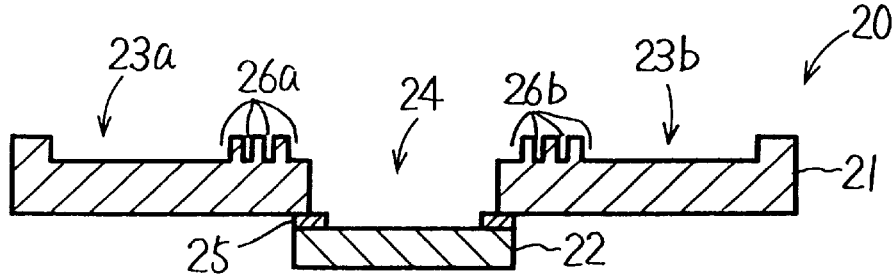
Figure 2C:

An apparatus 20 for crystal growth shown in FIGS. 2(a)–2(c) is composed of an upper substrate 21 and a lower substrate 22 bonded thereto. Upper substrate 21 is formed with two dents, one through hole, and two meandered grooves therebetween. The two dents correspond to storage parts 23a and 23b to retain liquid respectively. The two grooves correspond to passages 26a and 26b for transferring respective liquid from liquid storage parts 23a and 23b. Lower substrate 22 is bonded at the bottom of the through hole formed at substantially the center of upper substrate 21 so as to block the opening of the through hole. By the through hole formed in upper substrate 21 and lower substrate 22 blocking the through hole, a storage part 24 to retain the liquid introduced from passages 26a and 26b is formed. Upper substrate 21 and lower substrate 22 are formed of materials differing from each other. For example, upper substrate 21 is a glass substrate whereas lower substrate 22 is a substrate formed of a silicon semiconductor crystal. Lower substrate 22 formed of silicon semiconductor is preferably bonded to upper substrate 21 via an oxide film ($SiO_2$ film) 25 formed thereon. When the silicon substrate and the glass substrate are bonded by the anodic bonding method, the following steps, for example, can be taken. First, an $SiO_2$ film is formed on the surface of the silicon substrate, and a glass substrate is brought into contact with the silicon substrate. Then, they are heated to approximately 300° C., and high voltage (approximately 1 kV at most) is applied across them, so that the $SiO_2$ is fused at the interface to joint the silicon substrate and the glass.

Figure 3:
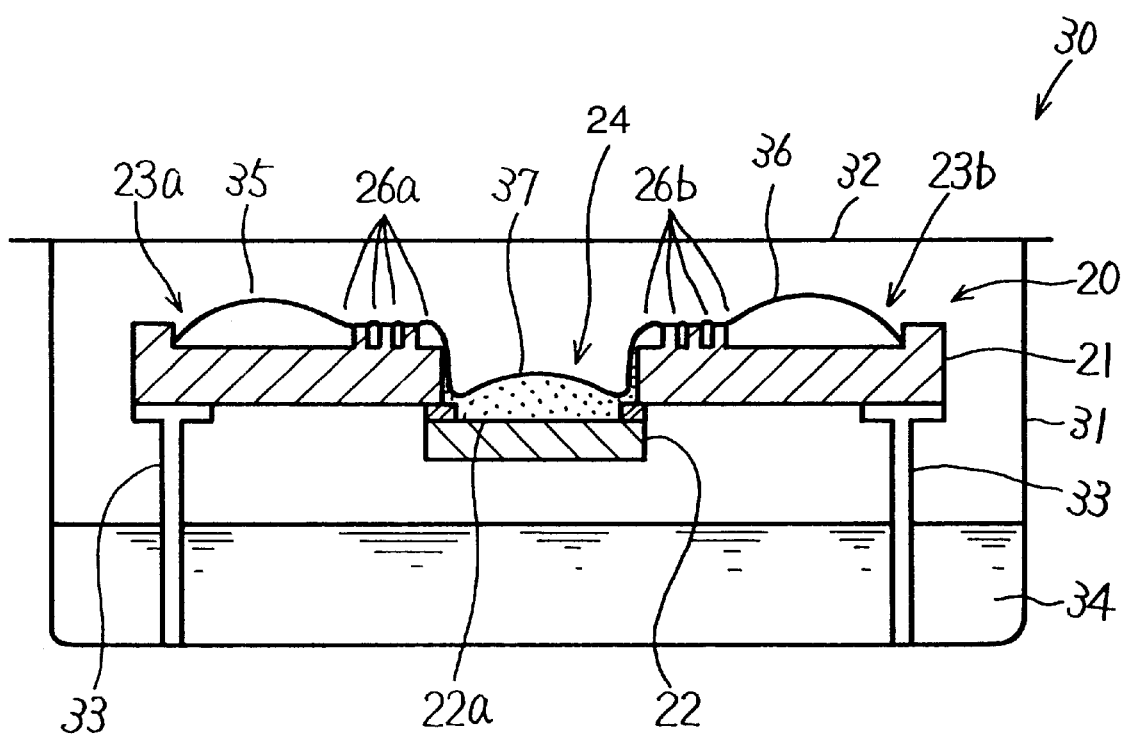
FIG. 3 is a schematic diagram showing a usage of the apparatus of FIGS. 2(a), 2(b), and 2(c).

The apparatus shown in FIGS. 2(a)–2(c) may be employed to give an apparatus 300 for crystal growth as shown in FIG. 3. Apparatus 20 composed of upper and lower substrates 21 and 22 is supported substantially horizontally by a support member 33 in a container 31 substantially sealed by a lid 32. A precipitant solution 34 is held in the container 31 to give a certain vaporization pressure. A liquid 35 useful for crystallization such as a buffer solution, a solvent, a precipitant solution or the like is held in liquid storage part 23a of upper substrate 21. A liquid 36 useful for crystallization such as a buffer solution, a solvent, a precipitant or the like is also held in the other storage part 23b. Liquids 35 and 36 may be the same or differ from each other. Liquids 35 and 36 flow into a liquid storage part 24 through passages 26a and 26b, respectively. A solution (a mother liquor) 37 containing a macromolecule to be crystallized such as protein is stored in advance in the liquid storage part 24. The mother liquor 37 is mixed with respective liquids 35 and 36 to give desirable conditions for crystallization.

In response to the liquid retained in the liquid storage part 24, as mentioned above, a certain electrical state is brought to the surface 22a of lower substrate 22 which is a semiconductor substrate whose valence electrons have been controlled by doping. Due to the electrostatic interaction, the compound such as protein can aggregate at surface 22a to form a crystal. A crystal nucleus is fixed on surface 22a to promote crystal growth.

As an alternative to the arrangement of the liquids shown in FIG. 3, initially, no liquid is placed in the storage part 24 while a reagent useful for crystallization is placed in the storage part 23a and a mother liquor containing a macromolecule to be crystallized is placed in the storage part 23b, and then they are mixed at the storage part 24 for crystal growth. When a complex of certain molecules is desired, one molecular species and a reagent useful for formation of the complex can be respectively supplied from storage parts 23a and 23b formed on the upper substrate 21 to the storage part 24 holding another molecular species. A plurality of storage parts and a passage or passages connecting them can control the preparation of conditions for crystallization in a single apparatus.

In the apparatus according to the present invention, the material whose valence electrons have been controlled is applied to the region for crystal growth while another material is applied to the region not concerned with crystal growth. This combination can increase flexibility of the shape, structure and the like of the apparatus, and decrease the cost of the apparatus. By bonding a plurality of worked substrates, a simple and compact apparatus can be obtained.

As shown in FIG. 3, a step is provided between storage part 23a or 23b and storage part 24. In such a structure, storage part 24 is located lower than storage part 23a or 23b in the direction of gravity. The step prevents the liquid in storage part 24 from flowing to storage parts 23a and 23. The step can make liquid pressure gap between the near side to storage part 24 and the near side to storage part 23a or 23b in passage 26a or 26b. The pressure gap can produce a driving force to allow liquids 35 and 36 to flow into storage part 24.

An apparatus 40 for crystal growth shown in FIGS. 4(a)–4(d) is suitable for carrying out screening for crystallization under various conditions. Apparatus 40 is composed of an upper substrate 41 and a lower substrate 42. Upper substrate 41 is formed with ten dents, five through holes, and ten grooves. Each of the dents form liquid storage parts 43a, 43b, 43c, 43d, 43e, 43f, 43g, 43h, 43i and 43j. The grooves communicating with respective dents form passages 46a, 46b, 46c, 46d, 46e, 46f, 46g, 46h, 46i and 46j. The five through holes formed at the center of upper substrate 41 are blocked by lower substrate 42. Upper substrate 41 is formed of glass, for example. Lower substrate 42 is formed of a doped semiconductor substrate. Upper substrate 41 is bonded to lower substrate 41 via an oxide film ($SiO_2$ film) provided on lower substrate 42. Liquid storage parts 44a, 44b, 44c, 44d and 44e are formed by the surface of lower substrate 42 and respective through holes formed in upper substrate 41. The liquid retained in respective liquid storage parts 43a–43j can flow into liquid storage parts 44a–44e through passages 46a–46j. In the present apparatus, five units each having three liquid storage parts connected by two passages are provided. A plurality of units each having a plurality of liquid storage parts connected by passages can be used to produce many crystallization conditions in a single apparatus.

Figure 5A:
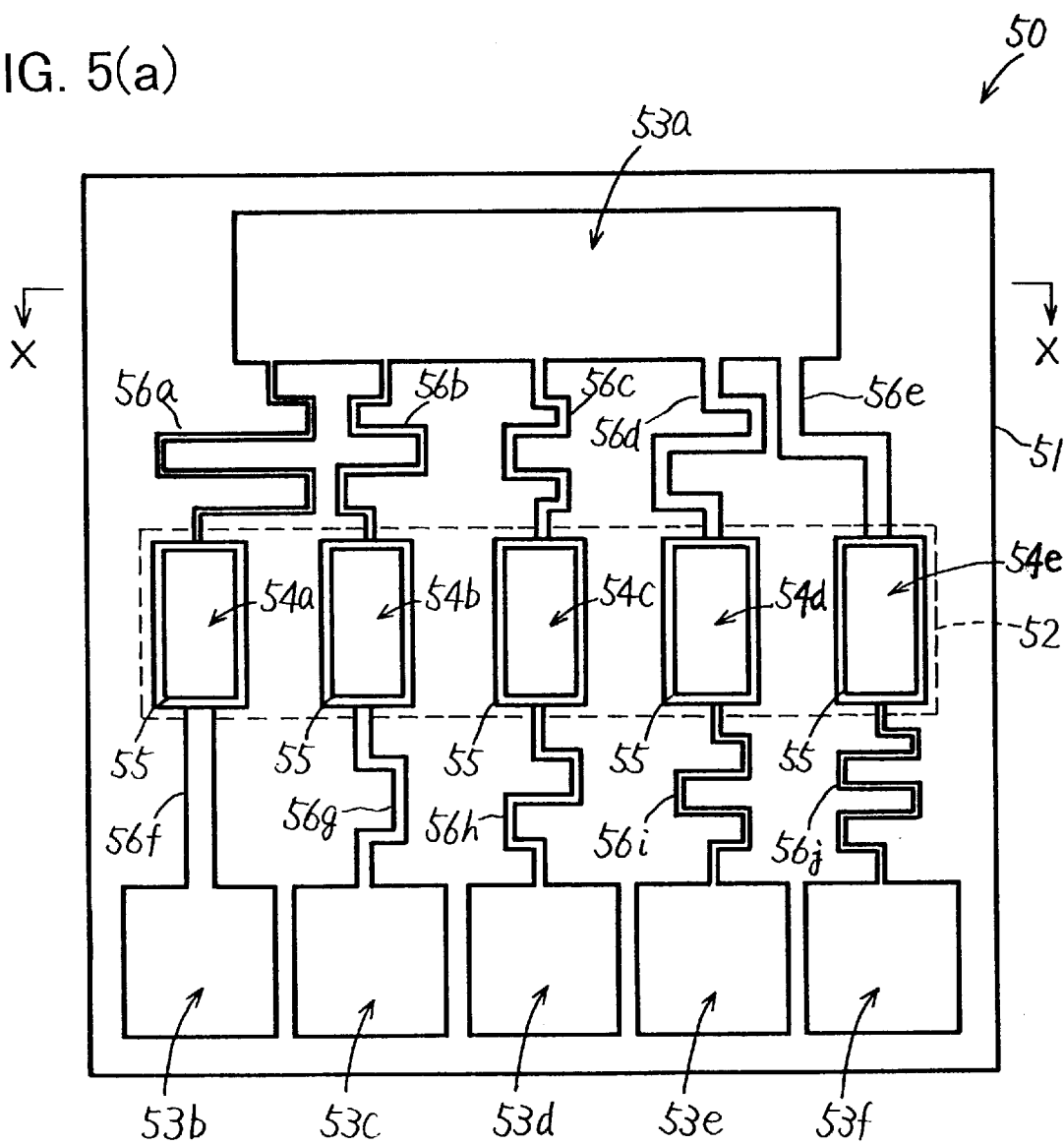
FIGS. 5(a) and 5(b) are a plan view and a sectional view taken along X—X, respectively, showing another embodiment of the apparatus for crystal growth according to the present invention.
Figure 5B:
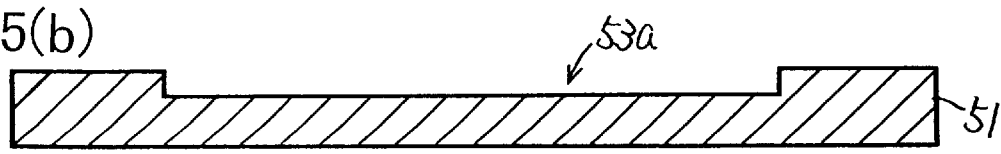

An apparatus 50 for crystal growth shown in FIGS. 5(a) and 5(b) is suitable for carrying out screening crystallization processes under various conditions. Apparatus 50 is composed of an upper substrate 51 and lower substrate 52. For example, upper substrate 51 is formed of glass, and lower substrate 52 is formed of a doped silicon semiconductor crystal. Lower substrate 52 is provided at the bottom of the five through holes formed at the center of upper substrate 51 so as to block the opening of the through holes. Lower substrate 52 is bonded to upper substrate 51 via oxide film 55 formed thereon. Liquid storage parts 54a, 54b, 54c, 54d and 54e are formed by these through holes and lower substrate 52. On upper substrate 51 are provided a liquid storage part 53a of a large area, and liquid storage parts 53b, 53c, 53d, 53e and 53f of a small area. Passages 56a, 56b, 56c, 56d and 56e of different length and width are connected to liquid storage part 53a. The liquid retained in liquid storage part 53a flows into liquid storage parts 54a–54e via passages 56a–56e at different flow rates. Passages 56f, 56g, 56h, 56i and 56j of different length and width are connected to liquid storage parts 53b–53f. Therefore, liquid can be transported from respective liquid storage parts 53b–53f at different flow rates. Since liquid storage parts 54a–54e receive liquid at different flow rates, the composition and concentration of the mixture obtained at each of storage parts 54a–54e differs. This apparatus is suitable in producing a plurality of different crystallization conditions using the same reagent.

Figure 6:
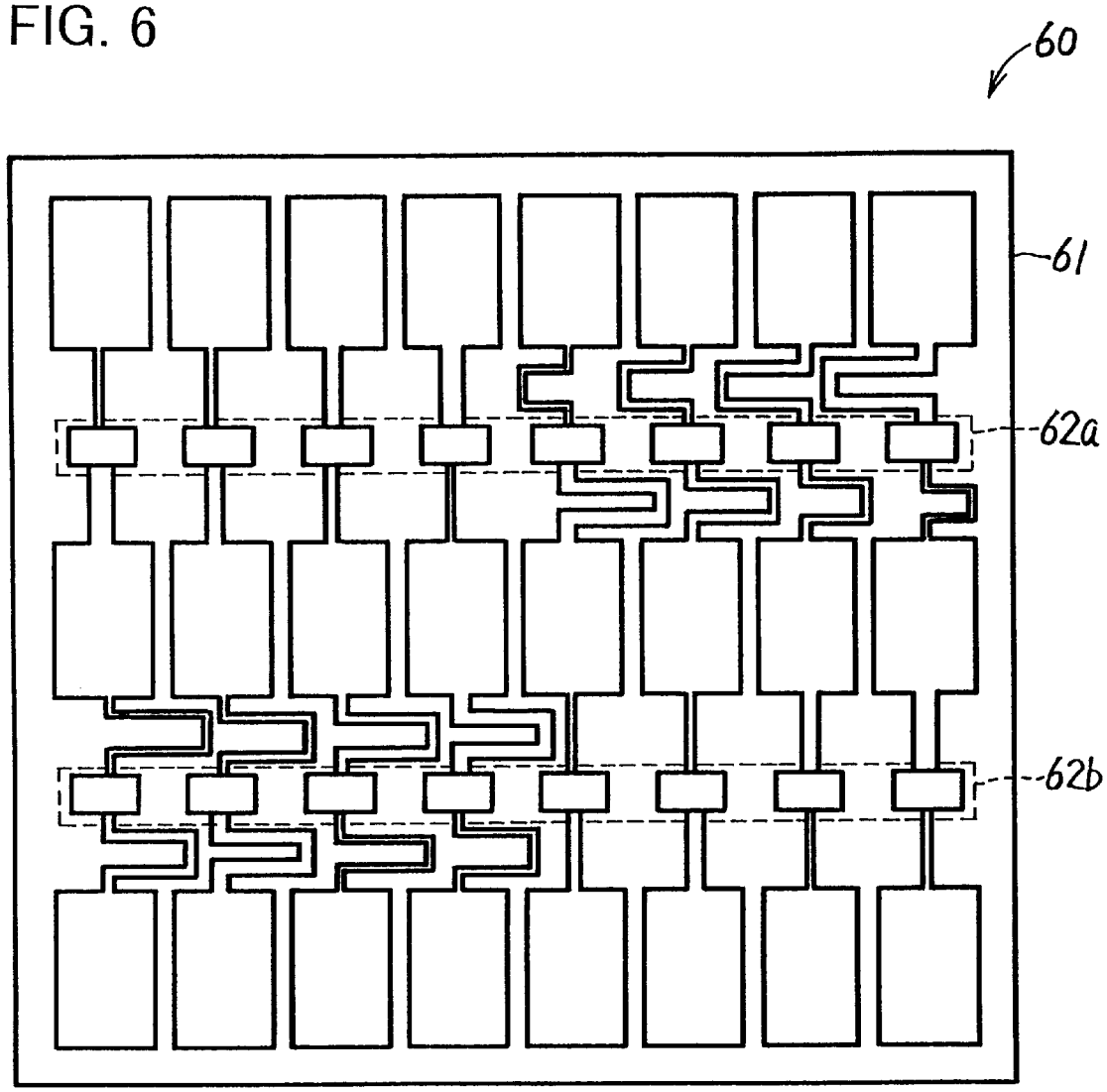
FIG. 6 is a plan view showing another embodiment of the apparatus for crystal growth according to the present invention.

An apparatus 60 for crystal growth shown in FIG. 6 is applicable in producing more crystallization conditions. Apparatus 60 is composed of an upper substrate 61 and lower substrates 62a and 62b. Similar to the apparatuses shown in FIGS. 2(a)–2(c), 4(a)–4(d) and 5(a)–5(b), these substrates are bonded to block the through holes provided in upper substrate 61. Upper substrate 61 is preferably formed of an insulative material such as glass, resin or the like. Lower substrates 62a and 62b are formed of a material whose valence electrons are controlled such as a doped semiconductor substrate. Apparatus 60 has twenty-four liquid storage parts for retaining the liquid required for crystallization, sixteen liquid storage parts where crystal growth is to be carried out, and thirty two passages connecting the storage parts. Since the width and length of these passages differ, the composition and concentration of the liquid retained in each liquid storage part for crystal growth differ. Apparatus 60 is suitable in producing more crystallization conditions using a plurality of reagents.

In the apparatus according to the present invention, a crystal of a biological macromolecule such as protein can grow on the surface of the material whose valence electrons are controlled. The net surface charge of the molecule dissociated in the solution can be compensated for at the surface of the material, whose valence electrons are controlled, whereby formation of a crystal nucleus and the two-dimensional arrangement can be controlled. In the crystal growth process at a small liquid storage part, the electrostatic attraction from the surface of the material whose valence electrons are controlled acts effectively to suppress the migration of the crystal nucleus caused by convection. Aggregateness between charged molecules in an electrolytic solution generally depends on the sum of the electric double layer repulsive force and van der Waals force acting between the molecules. Therefore, control of the concentration of salt added into the electrolytic solution to adjust the surface potential might be significant for the aggregation of molecules. In the apparatus according to the present invention, molecules can be effectively aggregated at the surface of the material having the electrostatic property adjusted in advance by valence electron control. When a doped semiconductor is used, the surface potential based on a space charge layer induced in the surface part of the material can be altered substantially in proportion to the concentration of the dopant. In the apparatus of the present invention, an adjusted concentration of salt can also be provided in the mixture prepared by transporting the reagents between a plurality of liquid storage parts.

As a specific material to have the valence electrons controlled, a semiconductor crystal such as crystalline silicon or the like is preferably used. A semiconductor substrate such as a silicon substrate generally used for a semiconductor device is one most appropriate material. Polycrystalline silicon, amorphous silicon, or the like deposited on an electrically insulative substrate such as a glass substrate is also a preferable material for valence electron control. Moreover, other inorganic materials and organic materials that are stable in the solution for crystallization and that can have the surface potential controlled by the valence electron control may be used.

In the apparatus of the present invention, the properties of the surface of the material having valence electrons controlled can be altered depending on the properties of the substance to be crystallized, difficulty or easiness of crystallization, and the like. In general, a smooth surface with few crystal defects is preferable. The surface of a semiconductor monocrystal such as a silicon monocrystal is generally extremely smooth and extremely low in crystal defect and fixed charge. Such a surface can advantageously suppress formation of excessive crystal nuclei. A semiconductor substrate such as a silicon substrate for a semiconductor device may be directly presented to the valence electron control. The surface of a polycrystalline silicon layer or an amorphous silicon layer, which is vapor-deposited on an insulative substrate such as a glass substrate, can also be used. Additionally, a silicon oxide film may be formed on the silicon surface to improve the hydrophilicity depending on the properties of the molecule to be crystallized.

Control of the valence electrons of a semiconductor material can be made by doping a specific impurity in a controlled concentration. Alteration of the type, concentration, distribution or the like of the dopant will modify the crystallizing performance of the surface of the material having the valence electrons controlled. The type and concentration of the dopant are desirably selected such that maximum crystallizing performance is given at the surface of the material. In addition, control of the distribution of the dopant can generate advantageous conditions for crystallization at a specific region. A specific type of impurity can be doped to a specific region of the material in a specific concentration so that a crystal can be preferentially grown at the specific region in the material surface. The valence electron control by doping impurity will be described taking silicon as an example hereinafter.

When an aqueous electrolytic solution containing a macromolecule dissociated with a negative net surface charge is brought in contact with an N or P-type silicon crystal whose valence electrons have been controlled, a Schottky barrier can be formed with respect to the N-type silicon surface while an ohmic contact can be obtained with respect to the P-type silicon surface. Constant supply of holes from the silicon bulk to the negative charged molecule at the P-type silicon surface (ohmic property) can lead to continued aggregation of the molecule at the silicon surface. In contrast, a certain surface potential depending upon the electrolyte concentration of the aqueous solution can be generated at the surface of the N-type silicon, and a space charge layer region can be formed inside. The amount of the space charge can also depends upon the dopant concentration of the N-type silicon. Therefore, the negative charged molecule in the electrolytic solution could continue to aggregate at the silicon surface until the positive space charge of the N-type silicon is compensated for. Thus, aggregation and crystallization of the macromolecule may occur in a limited manner with respect to the silicon surface having a space charge layer region formed, while aggregation of the macromolecule may proceed unlimitedly with respect to the silicon surface where ohmic contact is formed.

When two or more regions having different impurity concentrations are formed at the N-type silicon, for example, the regions may produce different crystallization manners. The difference in the effect between a high resistance N-type silicon of low impurity concentration and a low resistance N-type silicon of high impurity concentration will be discussed hereinafter. In the N-type silicon substrate of low dopant concentration (high resistance), the depletion layer capacity may be small due to a wide space charge layer formed in the proximity of the surface, and, therefore, the surface potential induced in the surface may be larger than that induced in the substrate of high impurity concentration (low resistance). The polarity of the surface potential which may be reverse to that of the net surface potential of the macromolecule may cause an accelerated aggregation of the macromolecule by electrostatic attraction. Thus, the N-type silicon substrate of low impurity concentration and high resistance can deposit more crystals on its surface than the N-type silicon substrate of high impurity concentration and low resistance.

As to macromolecules dissociated with positive net surface charge, a similar effect may be achieved by a reverse conductivity or resistance type to the above.

The above-described mechanism may be used to promote a crystal nucleus formation at a specific region of the substrate while suppressing it at another specific region. For example, when an N-type silicon region and a P-type silicon region are combined, crystal growth can be accelerated at one of the two regions and suppressed at the other region. The combination of an N or P-type silicon of high resistance and an N or P-type silicon of low resistance can produce a similar effect. In a method to make regions having different resistances and/or conductivity types at different places, layers of different conductivity types or resistances may be stacked and then etched at a specific region or regions, or impurity may selectively be doped into a specific region or regions at a silicon surface. In the former process, an island-shaped portion may be formed by etching as the region for crystallization, or a groove or hole portion may be formed by etching for crystallization. Promotion of crystallization at a specific region can be associated with suppression of excessive crystal nucleus formation or twin crystal growth.

Figure 7:
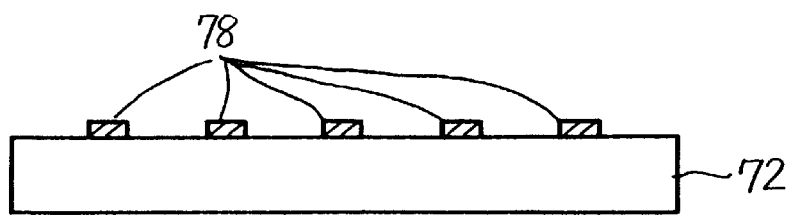
FIG. 7 is a sectional view showing the valence electron control material where a plurality of islands are formed.
Figure 8:
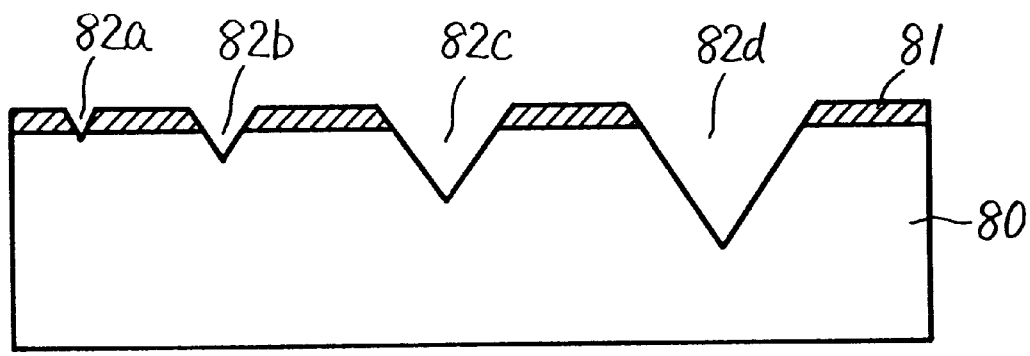
FIG. 8 is a sectional view showing a valence electron control material where a plurality of grooves of different sizes are formed.
Figure 9:
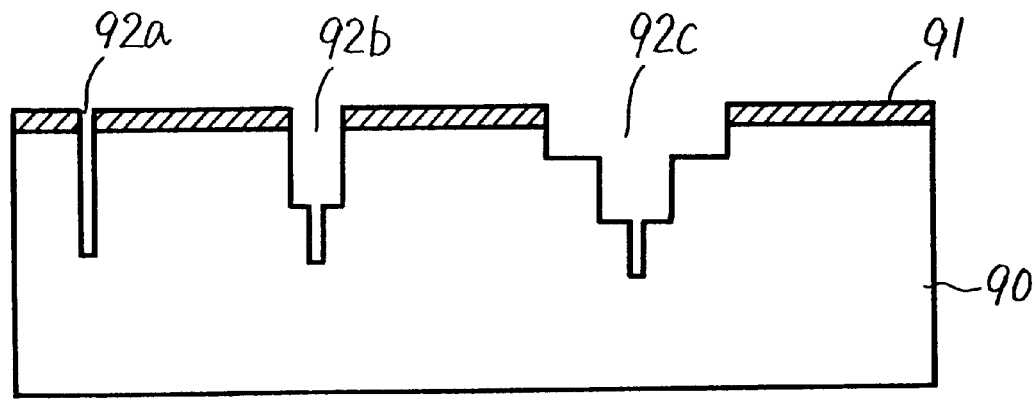
FIG. 9 is a sectional view of a valence electron control material where a plurality of grooves of different sizes are formed.

FIG. 7 shows a material having island-shaped crystallization regions. The conductivity type or resistance of each island region 78 is different from that of silicon substrate 72. As shown in FIGS. 8 and 9, a material having a plurality of grooves or holes may be employed. For example, an N-type silicon layer 81 is formed on the surface of a P-type silicon substrate 80. Further on the surface are formed a plurality of V-shaped grooves (V grooves) 82*a*, 82*b*, 82*c* and 82*d*. The V grooves have different depths and different widths of the opening. As shown in FIG. 9, an N-type silicon layer 91 is formed on the surface of a P-type silicon substrate 90. Further on the surface thereof are formed a plurality of concave grooves 92*a*, 92*b* and 92*c*. The grooves have different widths of the opening. Groove 92*a* has a well-shape or prismatic shape with the depth significantly longer than the width of the opening. Grooves 92*b* and 92*c* have a stepwise shaped inner wall. The width of the opening is reduced, as going to a deeper portion of the groove. The material shown in FIGS. 8 and 9 can promote crystallization of a macromolecule that is dissociated in a solution and has negative net surface charge. As to a macromolecule having an opposite dissociation property, the polarity of the silicon substrate may be set opposite to those shown in FIGS. 8 and 9. Specifically, when a macromolecule having positive net charge is to be crystallized from a solution, a material having a P-type silicon layer formed on an N-type silicon substrate can be used. In both types, the substrate material is exposed in the groove. A crystal can be grown stably in a groove where the substrate material is exposed.

Figure 10:
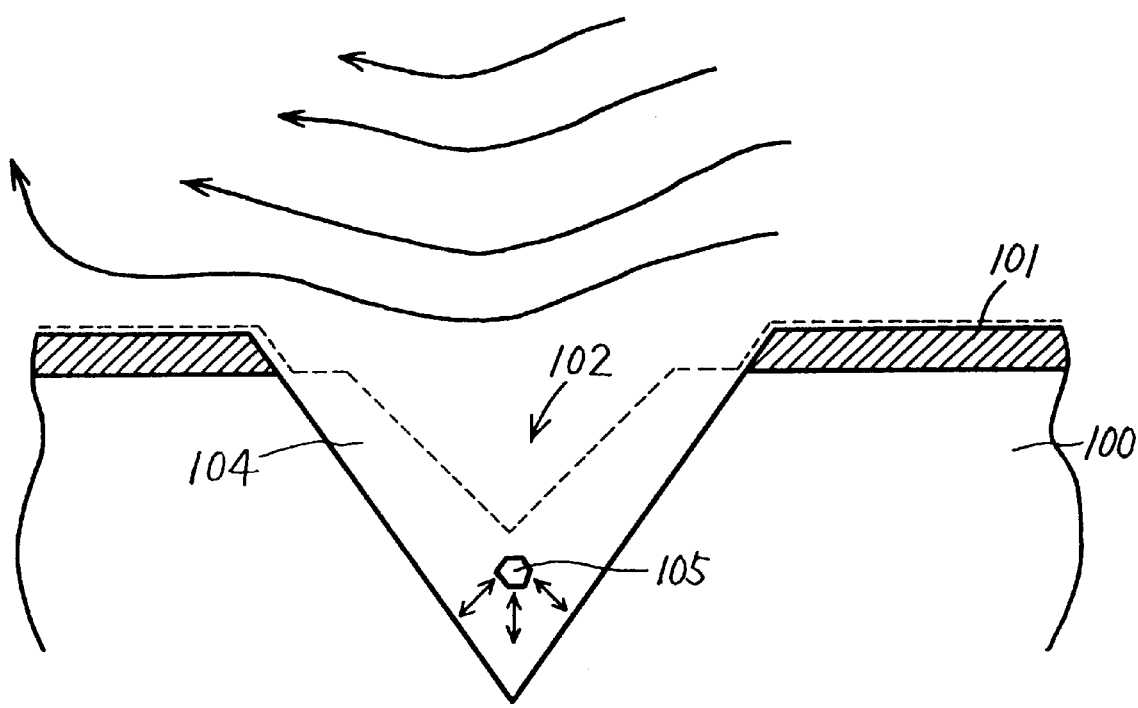
FIG. 10 is a schematic diagram showing the manner of stable crystal growth in a groove of the material whose valence electrons are controlled.
Figure 11:
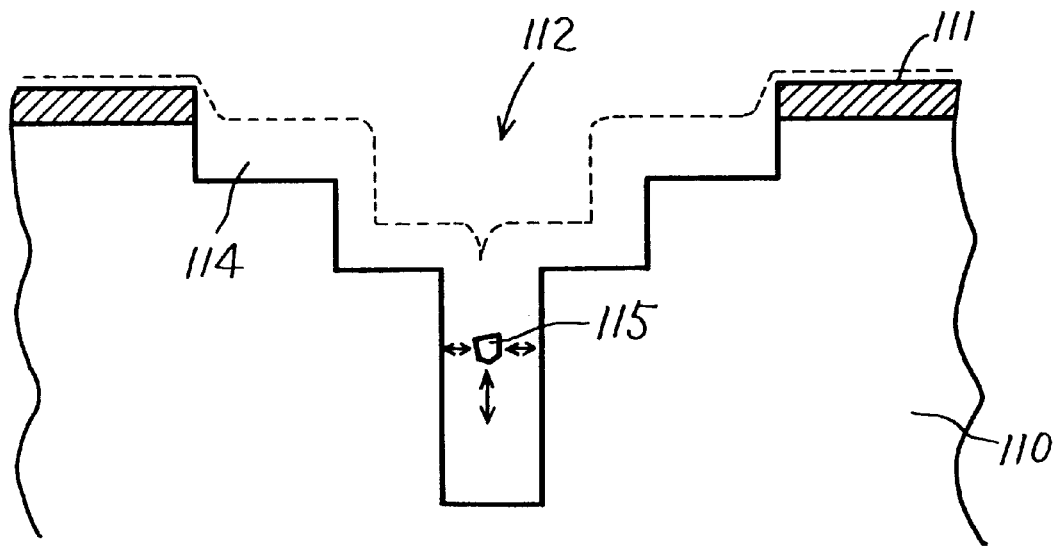
FIG. 11 is a schematic diagram showing the manner of stable crystal growth in a groove of the material whose valence electrons are controlled.

FIGS. 10 and 11 are directed to describe the function of grooves or holes with respect to crystal growth. As shown in FIG. 10, a V groove 102 formed of P or P$^-$ silicon may desirably provide a wider range of the electrostatic interaction with the dissociated macromolecule (the range may be considered as width of the electric double layer) in comparison with a surface portion 101 formed of a N or N$^+$ silicon layer. In the figure, the range which can exert effective electric interaction is defined by dotted lines as a region 104. Region 104 is thicker in V groove 102 than on surface portion 101. Particularly, on the deepest portion at the center of V groove 102, region 104 should be thickest due to the overlap of the interaction. On the deepest portion of V groove 102, a crystal nucleus or a molecular aggregate 105 that can form a crystal nucleus can feel electrostatic attraction substantially isotropically from the surface of the V groove to be arrested in the V groove. Thus, the effect of convection on molecular aggregate 105 in the solution, which is caused by gravity, can be suppressed by the electrostatic attraction, leading to stable formation of a crystal nucleus and stable crystal growth. On the other hand, formation of a crystal nucleus can be suppressed on surface portion 101 formed of N or N$^+$ silicon. Even if a crystal nucleus is formed at this surface portion, the width of the diffusion supply layer around the crystal nucleus may change by the influence of the convection in the solution to give low crystallinity or reduced growth rate. Thus, crystal growth can proceed selectively in groove 102 to give a large crystal. Stable crystal growth may be achieved by a similar mechanism also in the groove shown in FIG. 11. At the area of the smallest opening width of groove 112, a crystal nucleus 115 can be generated and arrested by electrostatic attraction. The region 114 where the electrostatic interaction is effective should be thickest on the deepest portion of groove 112. On the other hand, crystal formation can be suppressed on N or N+ silicon layer 111 formed on substrate 110. Thus, a crystal nucleus can be formed at a deep portion of groove 112 to give a grown crystal.

The material whose valence electrons are controlled preferably has a plurality of grooves, holes or islands formed. Plural types of grooves, holes or islands having different sizes are advantageously formed at a single material whose valence electrons are controlled. A variety of grooves, holes or islands of different sizes can produce different environments for crystallization. Preferably, the size of the groove, hole or island is altered within a suitable range depending on the type of the macromolecule to be crystallized. Regarding the size, the width is preferably in the range of 0.01–100 μm, and the length is preferably in the range of 0.1–10 mm. The grooves, holes or islands are preferably formed at an interval in the range of 1 μm–1 mm. The depth of the groove or hole is preferably in the range of 0.01–200 μm. These sizes are particularly preferable from the view of fabricating an apparatus for crystal growth. However, a groove, hole or island of size exceeding these ranges may be formed.

Figure 12:
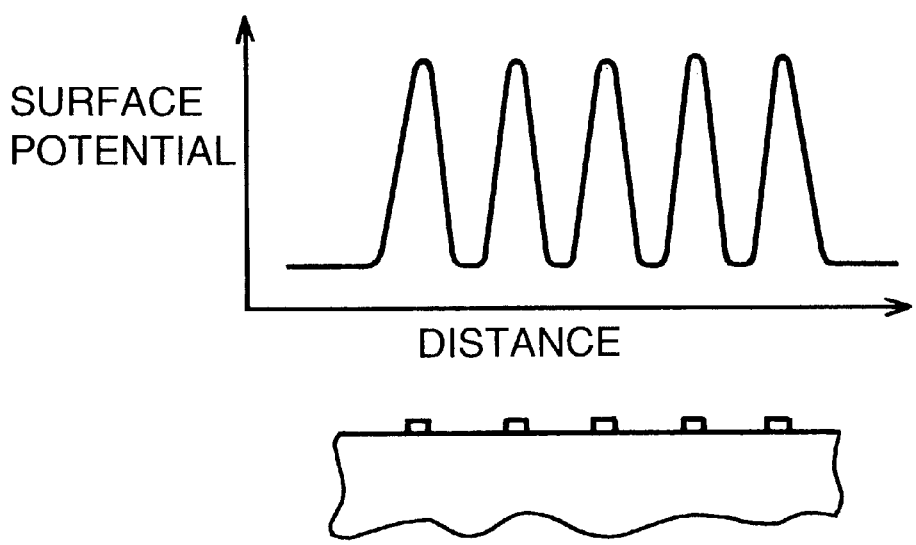
FIG. 12 is a schematic diagram showing distribution of surface potential of the valence electron control material where islands are formed.
Figure 13:
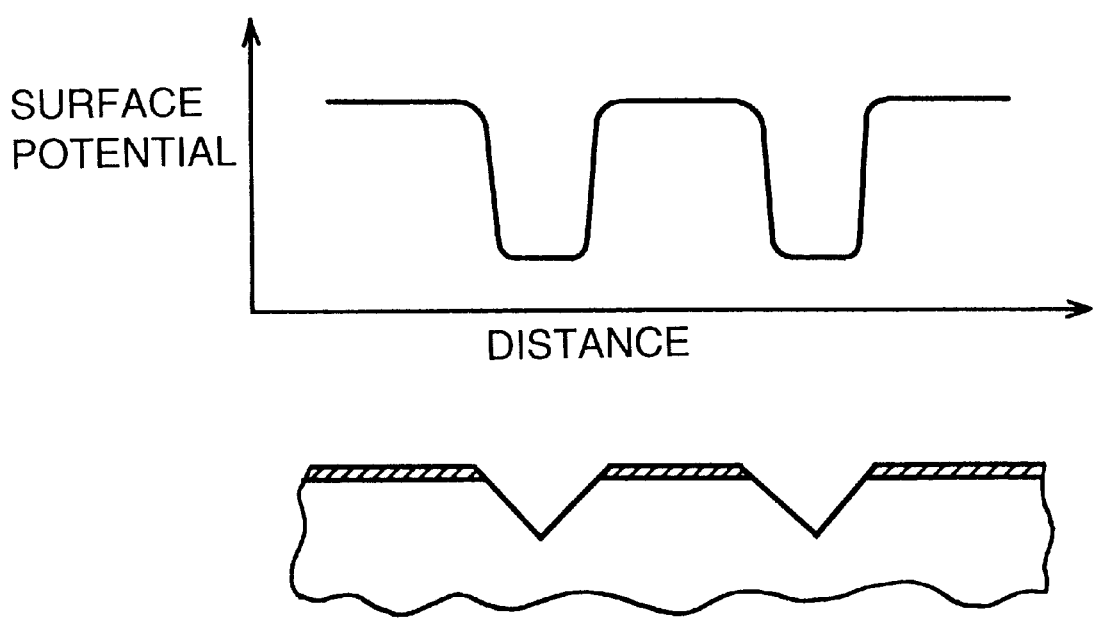
FIG. 13 is a schematic diagram showing distribution of surface potential of the valence electron control material where grooves are formed.
Figure 14A:
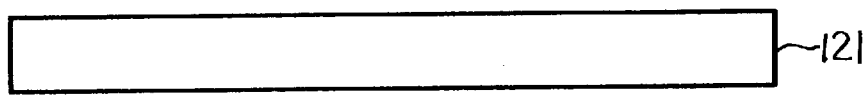
FIGS. 14(a) 14(b), 14(c), 14(d), 14(e), and 14(f) are schematic sectional views showing a process of preparing an upper substrate of the apparatus shown in FIGS. 2(a), 2(b), and 2(c).
Figure 14B:
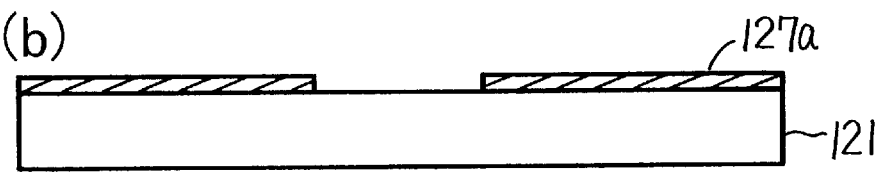
Figure 14C:
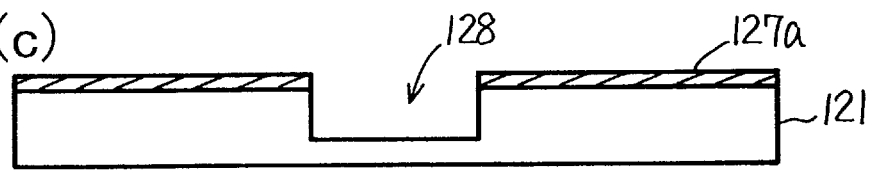
Figure 14D:
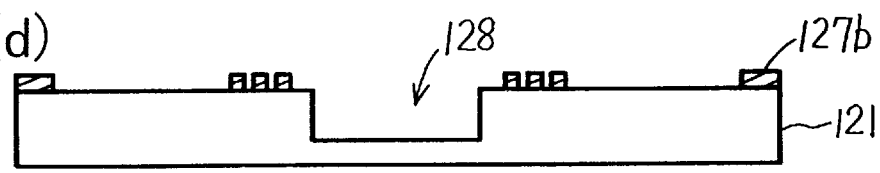
Figure 14E:
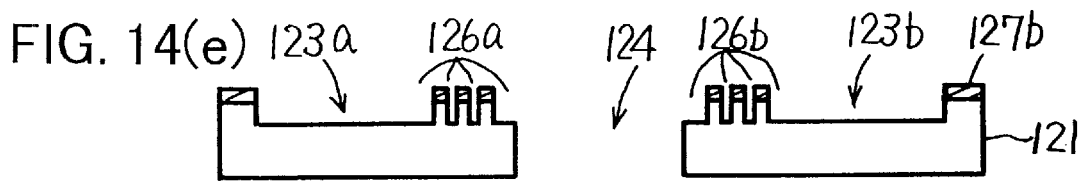
Figure 14F:
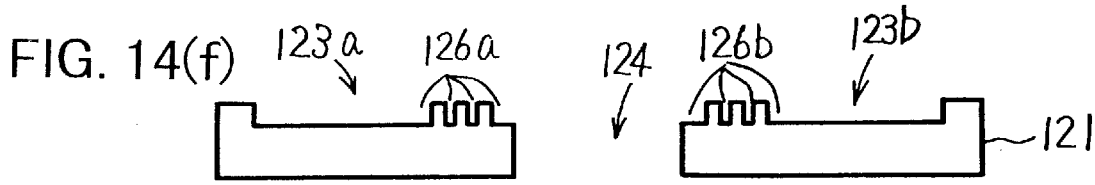
Figure 16A:
FIGS. 16(a), 16(b), 16(c), 16(d), 16(e), and 16(f) are schematic sectional views showing a process of preparing a lower substrate where a plurality of grooves are formed.
Figure 16B:
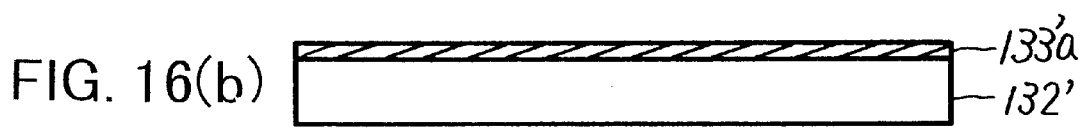
Figure 16C:
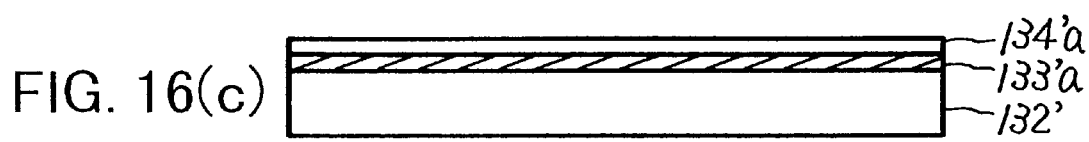
Figure 16D:
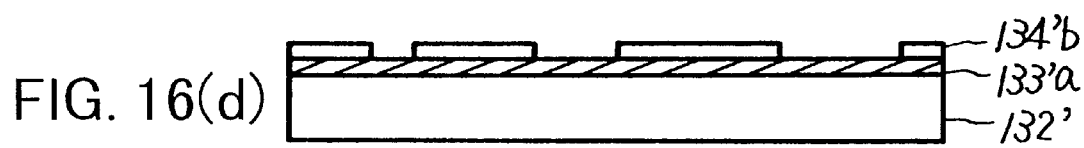
Figure 16E:
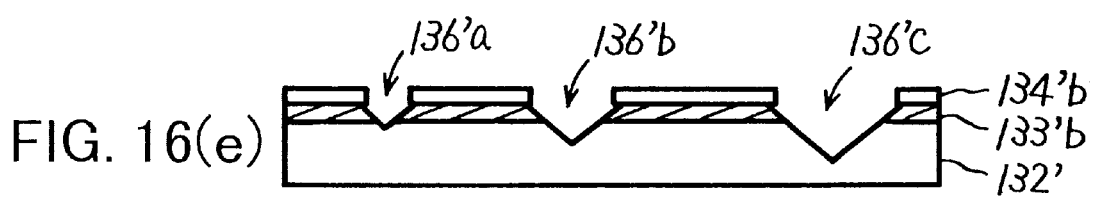
Figure 16F:
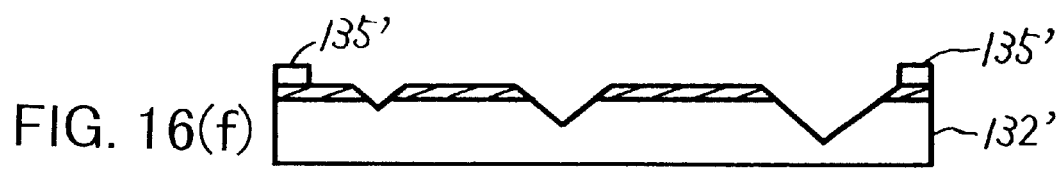
Figure 17A:
FIGS. 17(a), 17(b), 17(c), 17(d), and 17(e) are schematic sectional views showing a process of preparing a lower substrate having a plurality of grooves.
Figure 17B:
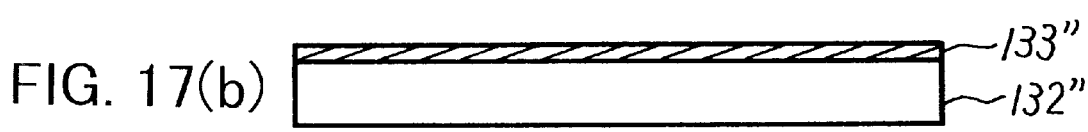
Figure 17C:
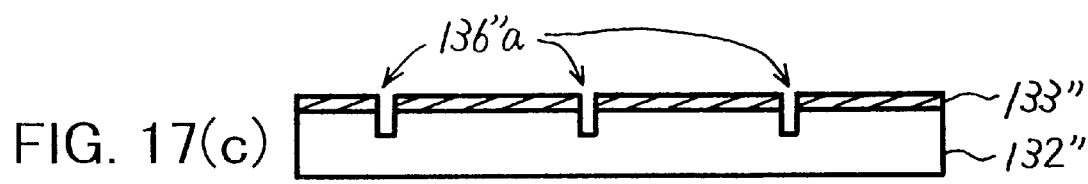
Figure 17D:
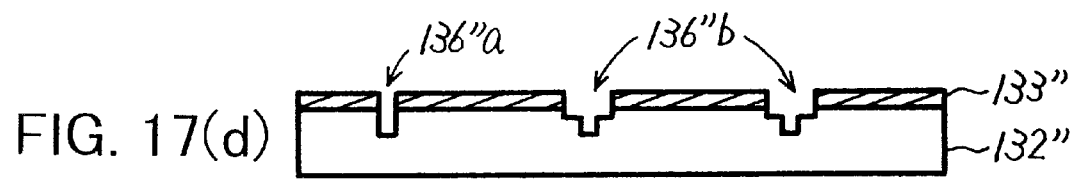
Figure 17E:
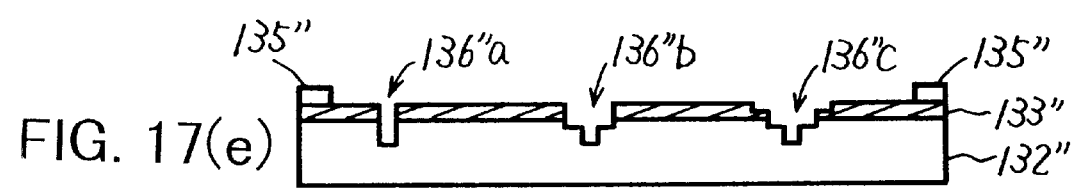
Figure 18A:
FIGS. 18(a), 18(b), 18(c), 18(d), and 18(e) are schematic sectional views showing a process to form regions of another conductivity type at the lower substrate by ion implantation.
Figure 18B:
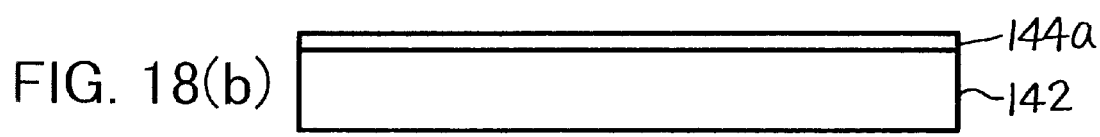
Figure 18C:
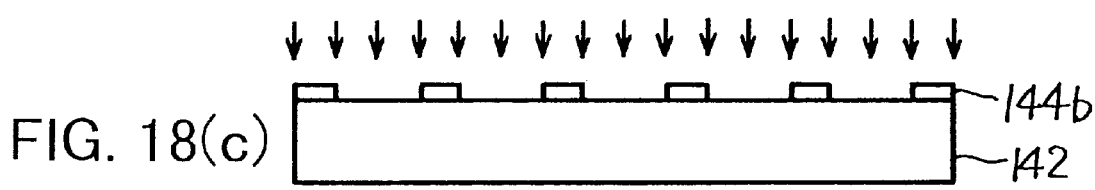
Figure 18D:
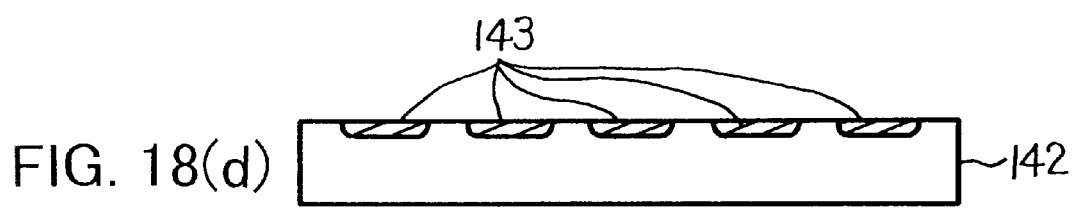
Figure 18E:
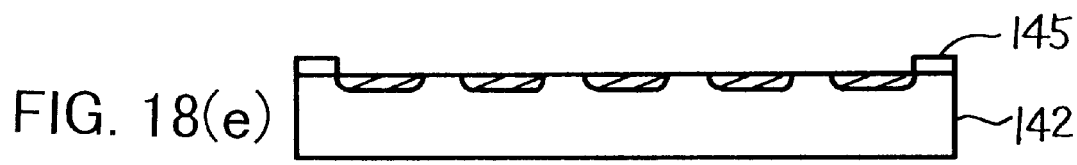

When islands of a P-type silicon are formed on an N-type silicon layer, the surface potential caused by their space charge may be as shown in FIG. 12, for example. The formation of a crystal nucleus would depend on the distribution of the surface potential. FIG. 13 shows the surface potential of a substrate formed with a groove. For example, after forming a P-type silicon layer all over on an N-type silicon layer, a groove is formed by etching to expose the N-type silicon layer. The groove having the N-type silicon layer exposed gives a lower surface potential.

The upper substrate of the apparatus for crystal growth shown in FIGS. 2(a)–2(c) is fabricated, for example as shown in FIGS. 14(a)–14(f). First, a substrate 121 of a size required for the apparatus is prepared (FIG. 14(a)). Substrate 121 is formed of glass, for example. A protection film 127a having a specific pattern is formed on substrate 121 (FIG. 14(b)). Protection film 127a having a hole at the center may be formed by a general lithography process using a resist material. Then, a hole 128 is formed at the center of substrate 121 by etching (FIG. 14(c)). When a glass substrate is to be etched, the wet etching method using an aqueous solution containing HF (hydrofluoric acid) or the sand blasting method can be used. Then, working is carried out to give a patterned protection film 127b (FIG. 14(d)). The patterned protection film is obtained using a general lithography process. Then, dents 123a and 123b and grooves 126a and 126b are formed by etching at the region of substrate 121 not covered with protection film 127b (FIG. 14(e)). In this step, the center hole is eroded to give a through hole 124. After removing the film, substrate 121 having dents 123a and 123b, through hole 124 and grooves 126 and 126b is obtained (FIG. 14(f)). The process using etching is suitable to make a more finely shaped structure. However, other methods may also be employed to make a substrate of a desired shape. For example, a supersonic drill may be used to work the substrate. Alternatively, molding may be employed when the substrate is formed of resin or the like.

The lower substrate of the apparatus shown in FIGS. 2(a)–2(c) may be prepared by the process as shown in FIGS. 15(a)–15(g), 16(a)–16(f), 17(a)–17(e) or 18(a)–18(e). FIGS. 15(a)–15(g) show a process to fabricate a lower substrate having a plurality of islands. First, a substrate 132 is prepared in a desired size (FIG. 15(a)). For example, substrate 132 is formed of silicon crystal. Then, ion implantation is carried out on substrate 132 (FIG. 15(b)). An impurity layer 133a is formed at a certain depth in substrate 132 (FIG. 15(c)). A silicon oxide (SiO$_2$) film 134a is formed on impurity layer 133a (FIG. 15(d)). Then, the silicon oxide film is etched to a specific pattern 134b (FIG. 15(e)). Etching the exposed substrate surface and subsequent removal of the silicon oxide film gives islands 133b of the impurity layer on substrate 132 (FIG. 15(f)). Then, a silicon oxide (SiO$_2$) film 135 is formed on the peripheral potion of substrate 132 having islands 133b of the impurity layer (FIG. 15(g)). The above process can be carried out according to the method generally employed in the fabrication of a semiconductor device.

FIGS. 16(a)–16(f) show a process for preparing a lower substrate having V grooves. A substrate 132' of silicon or the like is prepared in a desired size (FIG. 16(a)). An impurity layer 133'a is formed on substrate 132' (FIG. 16(b)). A silicon oxide film 134'a is formed on impurity layer 133'a (FIG. 16(c)). The silicon oxide film is etched to a desired pattern 134'b (FIG. 16(d)). Anisotropic etching of the exposed substrate surface gives grooves 136'a, 136'b and 136'c (FIG. 16(e)). After removing silicon oxide film 134'b, a silicon oxide film 135' is formed on a peripheral part of substrate 132', resulting in the lower substrate (FIG. 16(f)).

Alternatively, the groove may be formed as shown in FIGS. 17(a)–17(e). First, a substrate 132" of a desired size is prepared (FIG. 17(a)). Then, an impurity layer 133" is formed on substrate 132" by ion-implantation or the like (FIG. 17(b)). Following an appropriate lithography process, a groove 136"a is formed at a predetermined portion by dry etching (FIG. 17(c)). When an additional wide opening is to be formed, dry etching is repeated to give a plurality of grooves 136"b and 136"c that have anisotropic depth and different opening area (FIGS. 17(d) and 17(e)). After forming a silicon oxide film 135" on a peripheral portion of substrate 132", the lower substrate is obtained (FIG. 17(e)).

An impurity layer may be formed with a predetermined pattern at a specific region of a flat substrate, as shown in FIGS. 18(a)–18(e). First, a substrate 142 of a desired size is prepared (FIG. 18(a)). A protection film 144a is formed on substrate 142 (FIG. 18(b)). A protection film 144b patterned by lithography or the like is formed, and then ion implantation is carried out (FIG. 18(c)). An impurity layer 143 is formed at the region other than the protection film masked region (FIG. 18(d)). A silicon oxide film 145 is formed on the peripheral portion of substrate 143, resulting in a desired lower substrate (FIG. 18(e)).

Figure 19A:
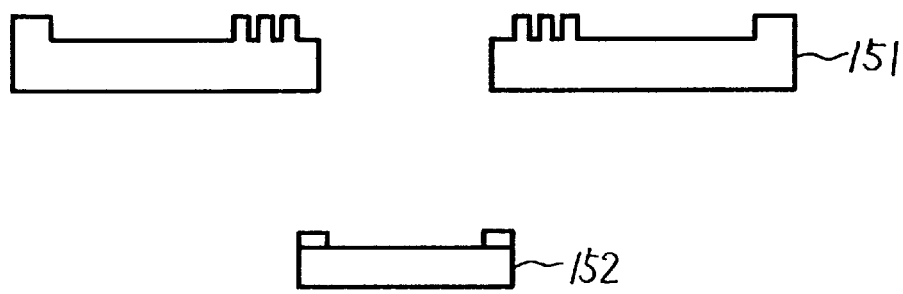
FIGS. 19(a) and 19(b) are schematic sectional views showing a process of fabricating an apparatus according to the present invention with the upper substrate and the lower substrate bonded.
Figure 19B:
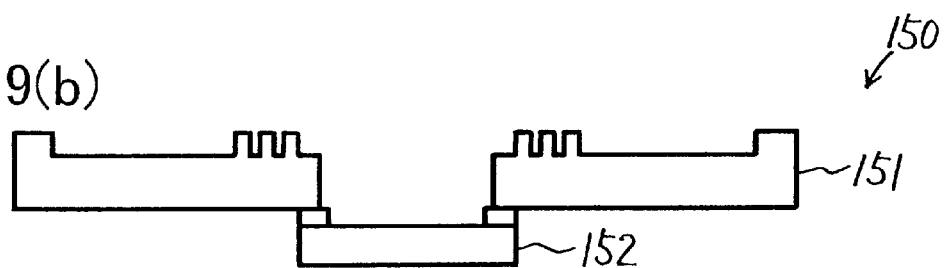

As shown in FIGS. 19(a) and 19(b), an apparatus for crystal growth of FIGS. 2(a)–2(c) may be obtained by combining upper and lower substrates. First, an upper substrate 151 and a lower substrate 152 as shown in FIG. 19(a) are prepared. Then, the substrates are bonded as shown in FIG. 19(b). Lower substrate 152 blocks the opening formed at the center of upper substrate 151. When a glass substrate and a silicon substrate are bonded, an anodic bonding method may be employed. When an employed material of the substrate has low heat resistance, an adhesive may be employed for bonding.

Figure 20A:
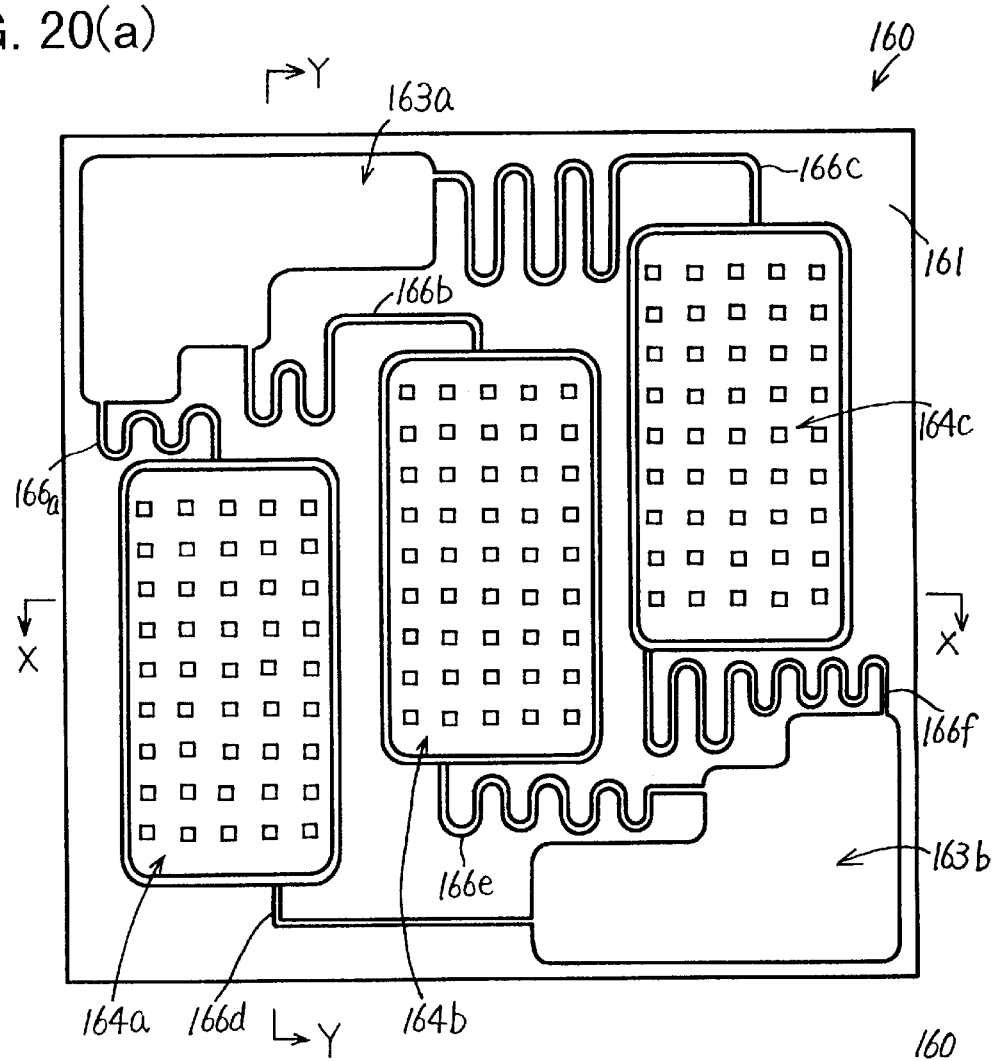
FIGS. 20(a), 20(b) and 20(c) are a plan view, a sectional view taken along X—X, and a sectional view taken along Y—Y, respectively, showing another embodiment of the apparatus for crystal growth according to the present invention.
Figure 20B:
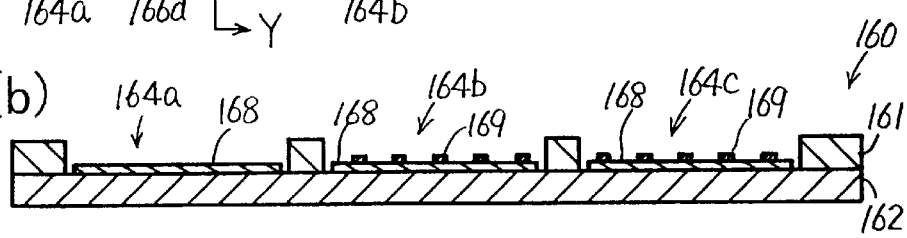
Figure 20C:
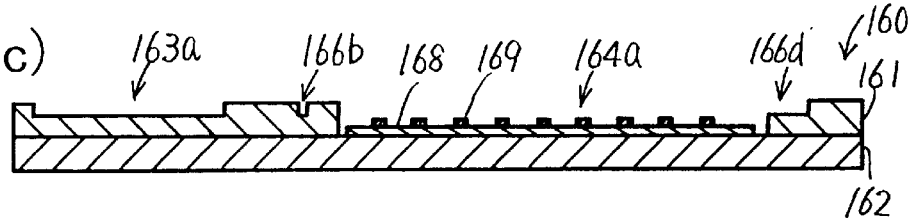
Figure 21A:
FIGS. 21(a), 21(b), 21(c), and 21(d) are schematic sectional views showing a process of preparing a lower substrate of the apparatus shown in FIGS. 20(a) 20(b), and 20(c).
Figure 21B:
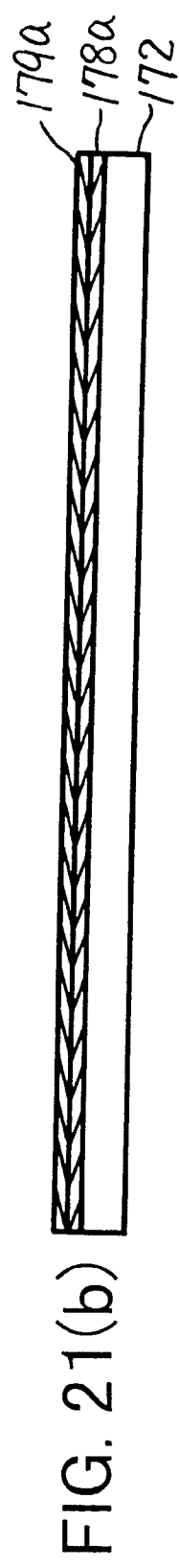
Figure 21C:
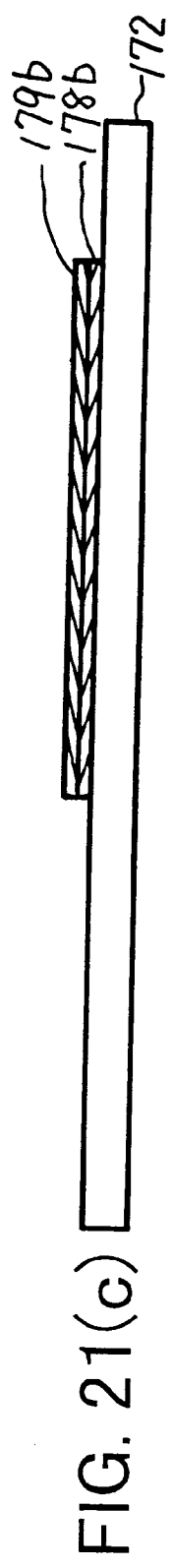
Figure 21D:
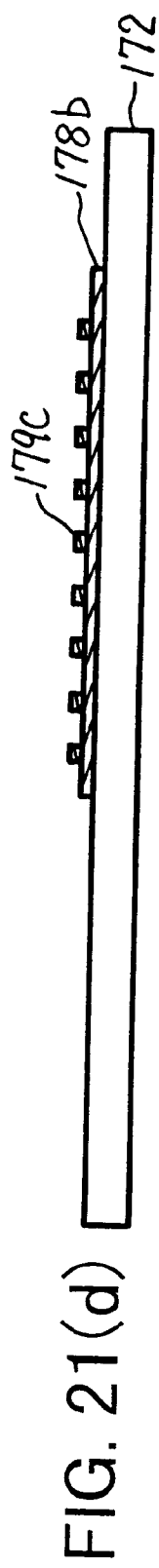
Figure 22A:
FIGS. 22(a) 22(b), 22(c), 22(d), 22(e), and 22(f) are schematic sectional views showing a process of preparing another lower substrate for the apparatus shown in FIGS. 20(a)–20(b), and 20(c).
Figure 22B:
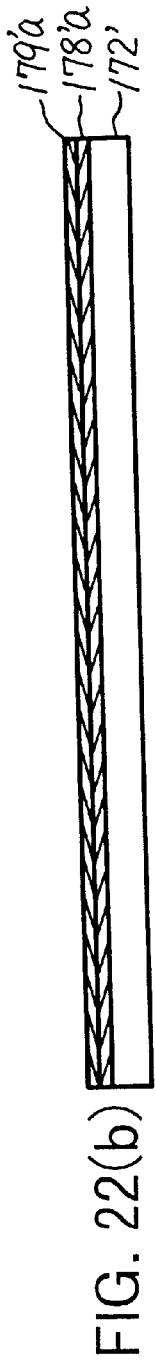
Figure 22C:
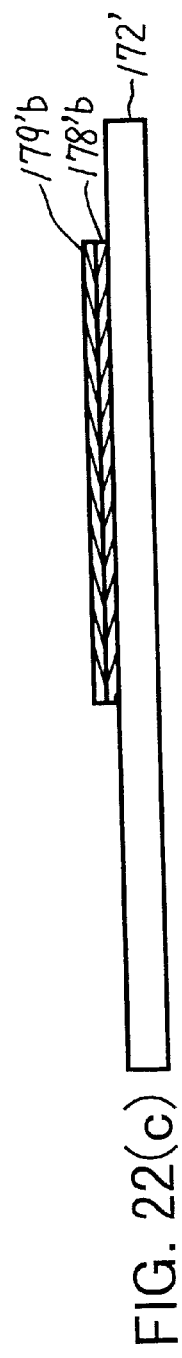
Figure 22D:
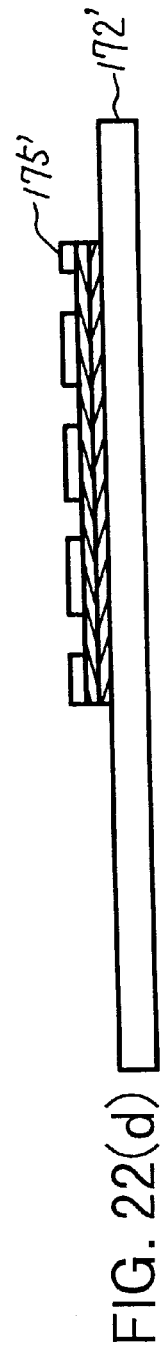
Figure 22E:
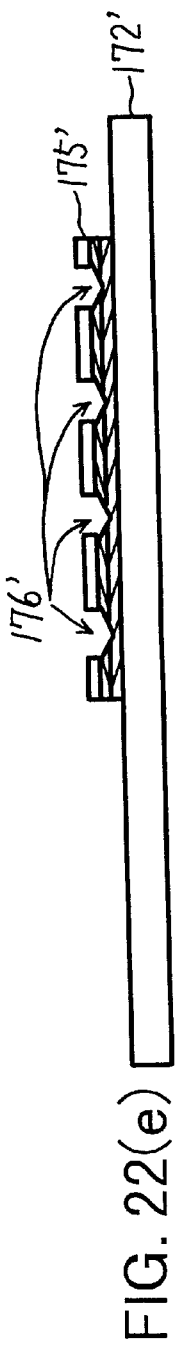
Figure 22F:
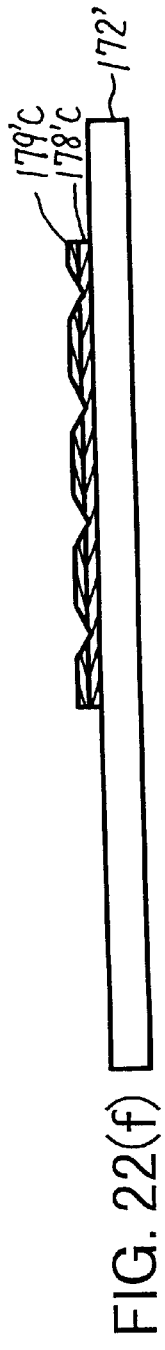

In the apparatus shown in FIGS. 20(a)–20(c), instead of the semiconductor substrate, a semiconductor layer deposited on a substrate formed of a material other than semiconductor is used for the lower substrate. Apparatus 160 for crystal growth is composed of an upper substrate 161 and a lower substrate 162. Upper substrate 161 has two dents, three through holes, and six grooves. Respective dents form liquid storage parts 163a and 163b. Liquid storage part 163a is connected with passages 166a, 166b and 166c each formed of a groove of different length. Liquid storage part 163b is connected with passages 166d, 166e and 166f each formed of a groove of different length. One pair of grooves is connected to each of the three through holes formed in upper substrate 161. Upper substrate 161 is typically formed of glass. Lower substrate 162 may also be formed of glass. A first semiconductor layer 168 is formed on lower substrate 162. A second semiconductor layer 169 having a different conductivity type or resistance from that of the first semiconductor layer is formed on first semiconductor layer 168. The islands of second semiconductor layer 169 are arranged in a matrix on first semiconductor layer 168. Upper substrate 161 is bonded to lower substrate 162 so that the semiconductor layer portions enters the through hole of upper substrate 161. Liquid storage parts 164a, 164b and 164c are formed by the through hole of upper substrate 161 and semiconductor layers 168 and 169 formed on lower substrate 162. The liquid retained in each of liquid storage parts 163a and 163b can flow into liquid storage parts 164a, 164b and 164c via passages 166a–166f.

As shown in FIGS. 21(a)–21(d), the semiconductor layer can be formed on the lower substrate with a desired pattern. First, a substrate 172 of glass or the like having a desired size is prepared (FIG. 21(a)). Next, a first semiconductor layer 178a and then a second semiconductor layer 179a are deposited on substrate 172 (FIG. 21(b)). Impurities of different concentrations and/or types are doped into the two semiconductor layers. Plasma CVD or the like can be employed to form the semiconductor layer. Then, the semiconductor layer is partially etched using lithography or the like to form patterned semiconductor layers 178b and 179b (FIG. 21(c)). Then, the second semiconductor layer is partially etched using lithography to obtain patterned second semiconductor layer 179c (FIG. 21(d)). The above steps give a lower substrate having islands of the second semiconductor layer arranged on the first semiconductor layer.

As an alternative to the lower substrate having islands of a semiconductor layer, a lower substrate having a groove formed in a semiconductor layer by the process shown in FIGS. 22(a)–22(f) may be used. First, a glass substrate 172' of a desired size is prepared (FIG. 22(a)). A first semiconductor layer 178'a and a second semiconductor layer 179'a are deposited by plasma CVD or the like on substrate 172' (FIG. 22(b)). Etching both semiconductor layers gives patterned first and second semiconductor layers 178'b and 179'b (FIG. 22(c)). A silicon oxide film ($SiO_2$ film) 175' having a specific pattern is formed on the semiconductor layer (FIG. 22(d)). Anisotropic etching using silicon oxide film 175' as a mask gives a plurality of V grooves 176' (FIG. 22(e)). Then, the silicon oxide film is removed (FIG. 22(f)). On glass substrate 172', the obtained first and second semiconductor layers 178'c and 179'c have a plurality of V grooves. First semiconductor layer 178'c is exposed at the bottom of the V groove.

The upper substrate of the apparatus shown in FIGS. 20(a)–20(c) may be prepared by the process shown in FIGS. 23(a)–23(f). First, a substrate 181 of glass or the like having a desired size is prepared (FIG. 23(a)). A protection film 187a having a prescribed pattern is formed on substrate 181 (FIG. 23(b)). A hole 188 is formed in substrate 181 by etching (FIG. 23(c)). Then, a patterned protection film 187b is formed (FIG. 23(d)). Etching using protection film 187b as a mask, a dent 183, a groove 186a, and a through hole 184 are formed on substrate 181 (FIG. 23(e)). Then, after removing the protection film, an upper substrate having a necessary configuration is obtained (FIG. 23(f)).

Figure 24A:
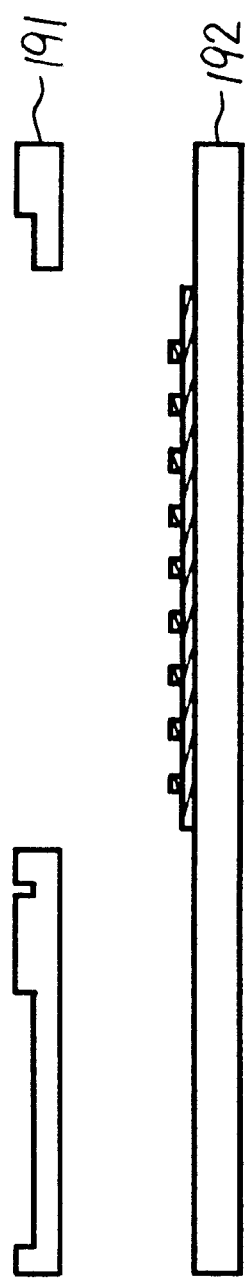
FIGS. 24(a) and 24(b) are schematic sectional views showing a process of fabricating the apparatus shown in FIGS. 20(a)–20(b), 20(c) by bonding the upper substrate and the lower substrate.
Figure 24B:
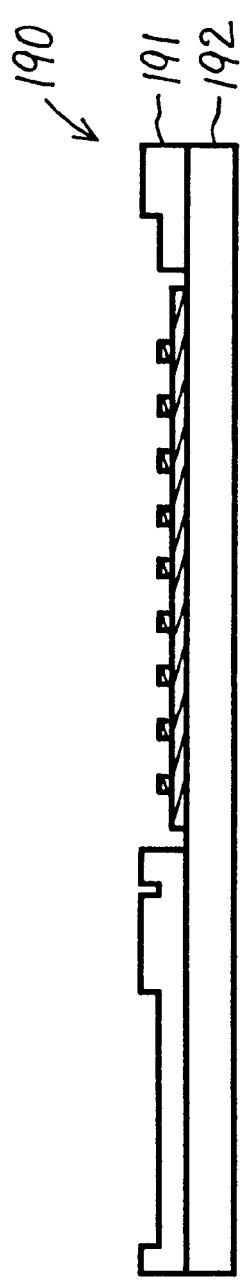

Two substrates are bonded as shown in FIGS. 24(a) and 24(b). As shown in FIGS. 24(a), upper substrate 121 and lower substrate 192 are arranged facing each other. As shown in FIG. 24(b), upper substrate 191 and lower substrate 192 are bonded so that the semiconductor layer portion enters the through hole of upper substrate 191, resulting in an apparatus 190 for crystal growth. An anodic bonding method is preferably used for bonding.

Figure 25:
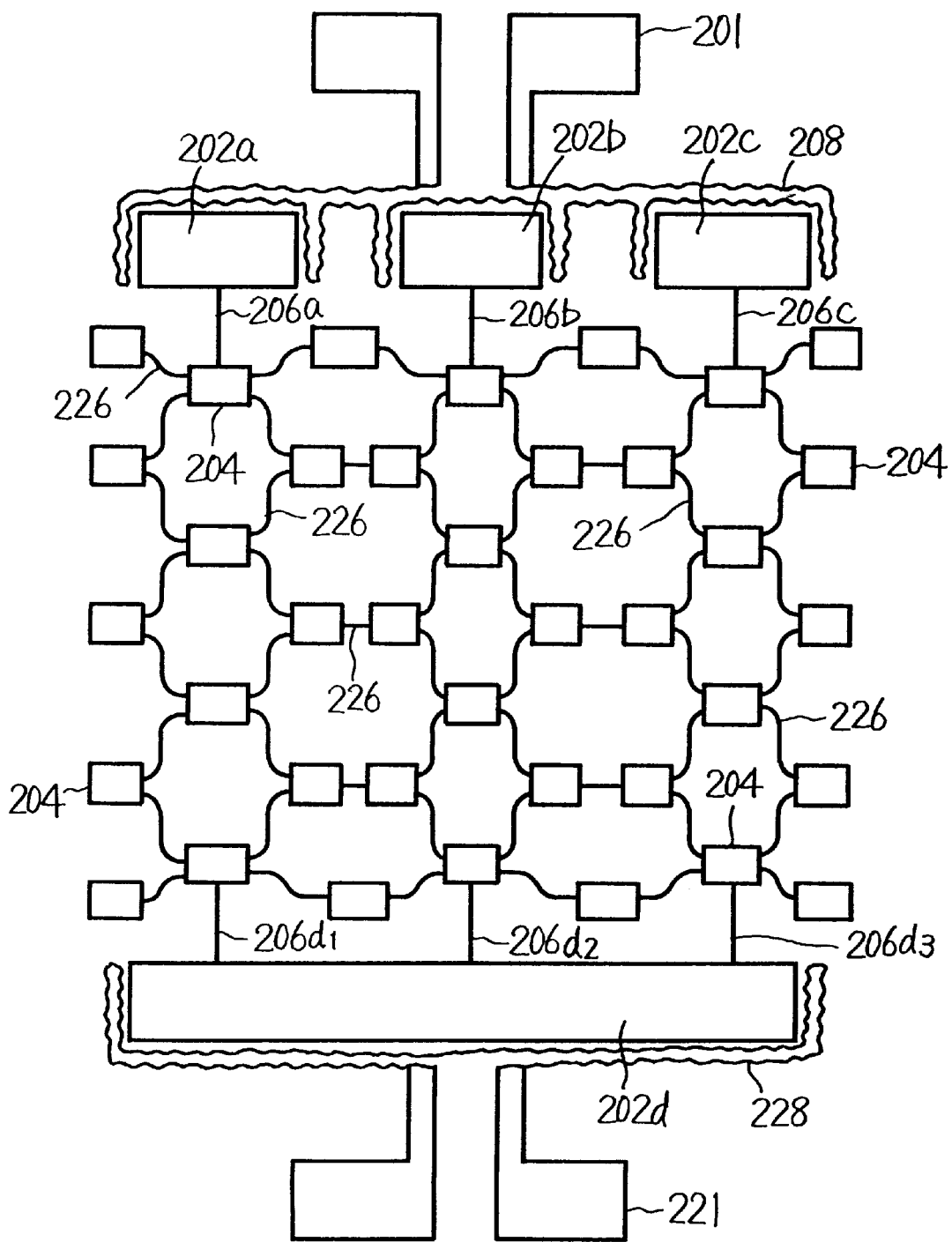
FIG. 25 is a schematic diagram showing another embodiment of the apparatus for crystal growth according to the present invention.

According to the present invention, an apparatus as shown in FIG. 25 may also be provided. The apparatus has a plurality of solution storage parts 202a, 202b, 202c, 202d and 204 formed. Solution storage parts 202a–202d correspond to the first liquid storage part according to the present invention. A solution containing a macromolecule and another necessary solution are retained respectively in these parts. A large number of liquid storage parts 204 correspond to the second liquid storage part of the present invention. Liquid storage part 204 is formed on a material whose valence electrons are controlled such as an impurity-added semiconductor substrate. Solution storage parts 202a–202d are formed on a general-purpose material such as glass. Many solution storage parts 204 serve to receive plural types of solutions supplied from solution storage parts 202a–202d to prepare mixtures. At solution storage part 204, the solution containing a macromolecule encounters another solution, so that conditions for crystallization are prepared. Optimum crystallization conditions may be produced in any one of many solution storage parts 204 to give a promoted crystallization. Solution storage part 202a is linked to solution storage part 204 through passage 206a. Similarly, storage parts 202b, 202c and 202d are linked to a corresponding storage part 204 through passages 206b, 206c, 206d1, 206d2 and 206d3. Passages 226 are provided between many solution storage parts 204. Passage 226 connects adjacent storage parts 204 with each other. An electrode 208 for heating is formed at a periphery of storage parts 202a, 202b and 202c. Electrode 208 is connected to a pad 201. An electrode 228 for heating is also provided at a periphery of storage part 202d. Electrode 228 is connected to a pad 221. Electrodes 208 and 228 are energized via pads 201 and 221 to heat the solution retained in storage parts 202a–202d. The heating promotes the migration of the solution.

Figure 26:
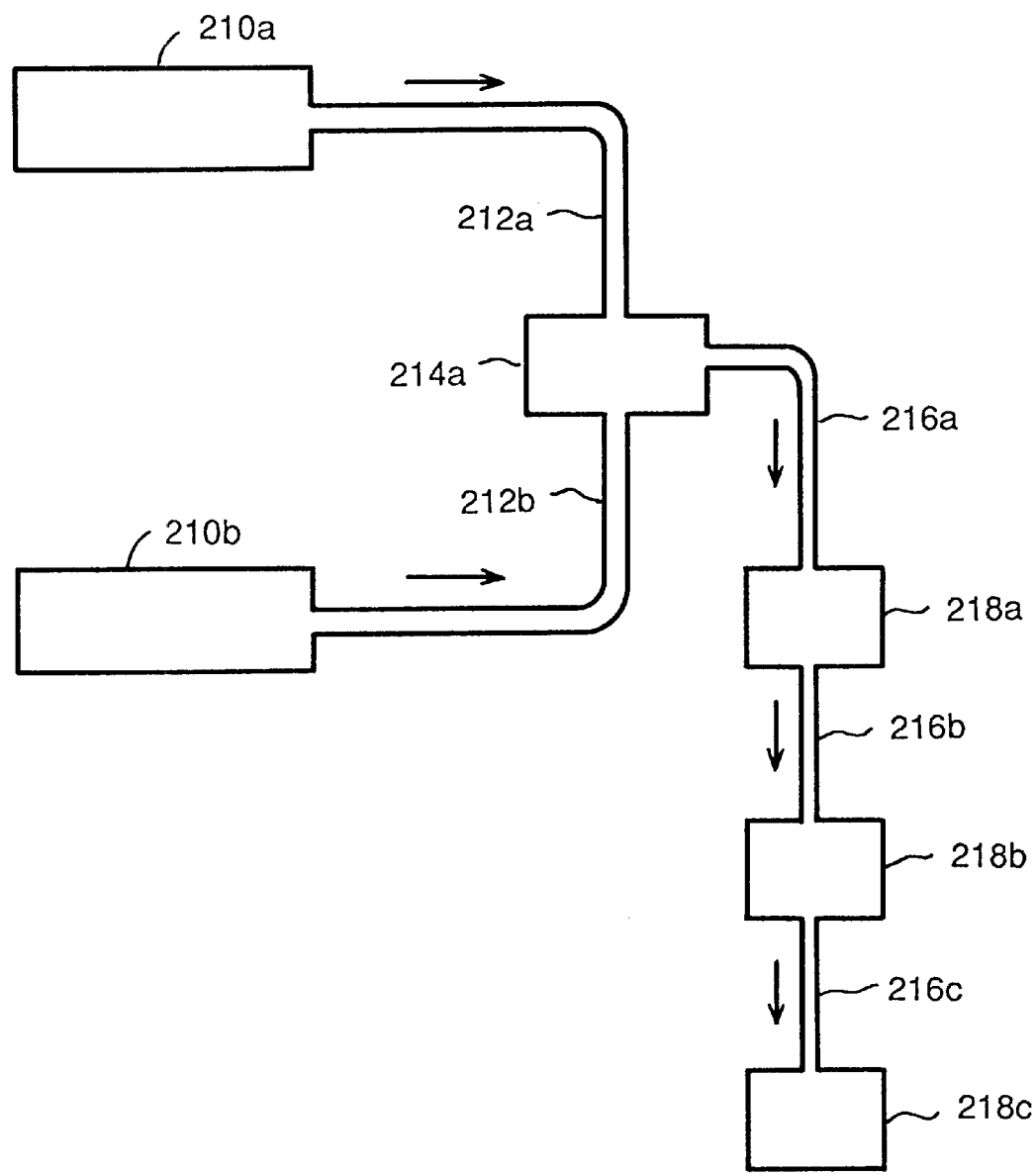
FIG. 26 is a schematic diagram showing another embodiment of the apparatus for crystal growth according to the present invention.

The apparatus according to the present invention may include a system to drain a liquid from the liquid storage part for crystal growth. This system may include a passage to drain a liquid from the liquid storage part for crystal growth, and a liquid storage part for receiving the drained liquid from the passage. FIG. 26 shows an embodiment of such an apparatus including the draining system. In the apparatus of FIG. 26, solution cells 210a and 210b corresponding to the first liquid storage part, a reaction cell 214a corresponding to the second liquid storage part, and drain cells 218a, 218b and 218c are arranged at appropriate positions. Solution cells 210a and 210b are connected to reaction cell 214a by passages 212a and 212b, respectively. Reaction cell 214a is connected with drain cell 218a by a passage 216a. Passages 216b and 216c are provided between drain cells 218a and 218b and between drain cells 218b and 218c. The solution flow in the direction of the arrow. Reaction cell 214a, drain cells 218a, 218b and 218c, and passages 216a, 216b and 216c may be formed on a material whose valence electrons are controlled such as a doped semiconductor substrate. Solution cells 210a, 210b and passages 212a and 212b may be formed on a general-purpose material such as glass. The number of the cells is not limited to those shown in FIG. 26. For example, three or more solution cells may be provided. Also, two or more reaction cells may be provided. On the other hand, the drain cell may be one or two, or at least four. Passages may be provided depending on the number and arrangement of respective reaction cells. The drain cell, the passage connecting reaction cell to the drain cell, and the passage connecting the drain cells do not necessarily have to be formed on a material whose valence electrons are controlled, but may be formed on a general-purpose material such as glass. In this case, a third substrate such as a glass substrate may be bonded to the bottom of the substrate where the reaction cell is formed. The drain cell is formed on the third substrate for the flow of the solution from the reaction cell to the drain cell. The obtained apparatus has a three-stage structure composed of an upper substrate where the solution cell is formed, an intermediate substrate where the reaction cell is formed, and a lower substrate where the drain cell is formed, wherein the upper and lower substrates are formed of a general-purpose material such as glass and the intermediate substrate is formed of a material whose valence electrons are controlled such as a semiconductor substrate. In using the apparatus, mother liquor containing a macromolecule such as protein to be crystallized may be supplied from solution cell 210a whereas a solution for controlling the conditions for crystallization such as a buffer solution may be supplied from solution cell 210b. Reaction cell 214a receives these solutions to prepare a mixture suitable for crystallization. When a complex of molecules is to be formed, a molecular species to form a complex may be held in reaction cell 214a while another molecular species and a solution for conditioning may be held in solution cells 210a and 210b, respectively. The reaction is induced by supplying respective solutions from solution cells 210a and 210b to reaction cell 214a.

FIG. 27 shows a passage for allowing a liquid to flow unidirectionally. The passage shown in the figure is composed of a plurality of V grooves formed on the surface of a substrate. FIG. 28 is a sectional view taken along L—L' of FIG. 27. FIGS. 29(a)–29(c) are sectional views taken along X—X', Y—Y' and Z—Z', respectively of FIG. 27. Passage 222 is composed of V grooves 222a, 222b and 222c having different widths and depths. The arrow indicates the flowing direction of the liquid. The width and depth of the V grooves become greater as going from the upper stream to the lower stream. Since the width of the passage is constant, the V groove density becomes smaller as going from the upper stream to the lower stream. In this structure, passage 222 has a stepwise shape with V grooves 222a, 222b and 222c as shown in FIG. 28. In the passage of such a structure, liquid flows in the direction of the arrow by capillarity while flow of the solution in the opposite direction is prevented. The groove is not limited to a V shape, but another shape of groove such as a U-shape may also be used. The groove may be formed directly on the substrate, or may be formed on a film formed on the substrate.

Figure 30:
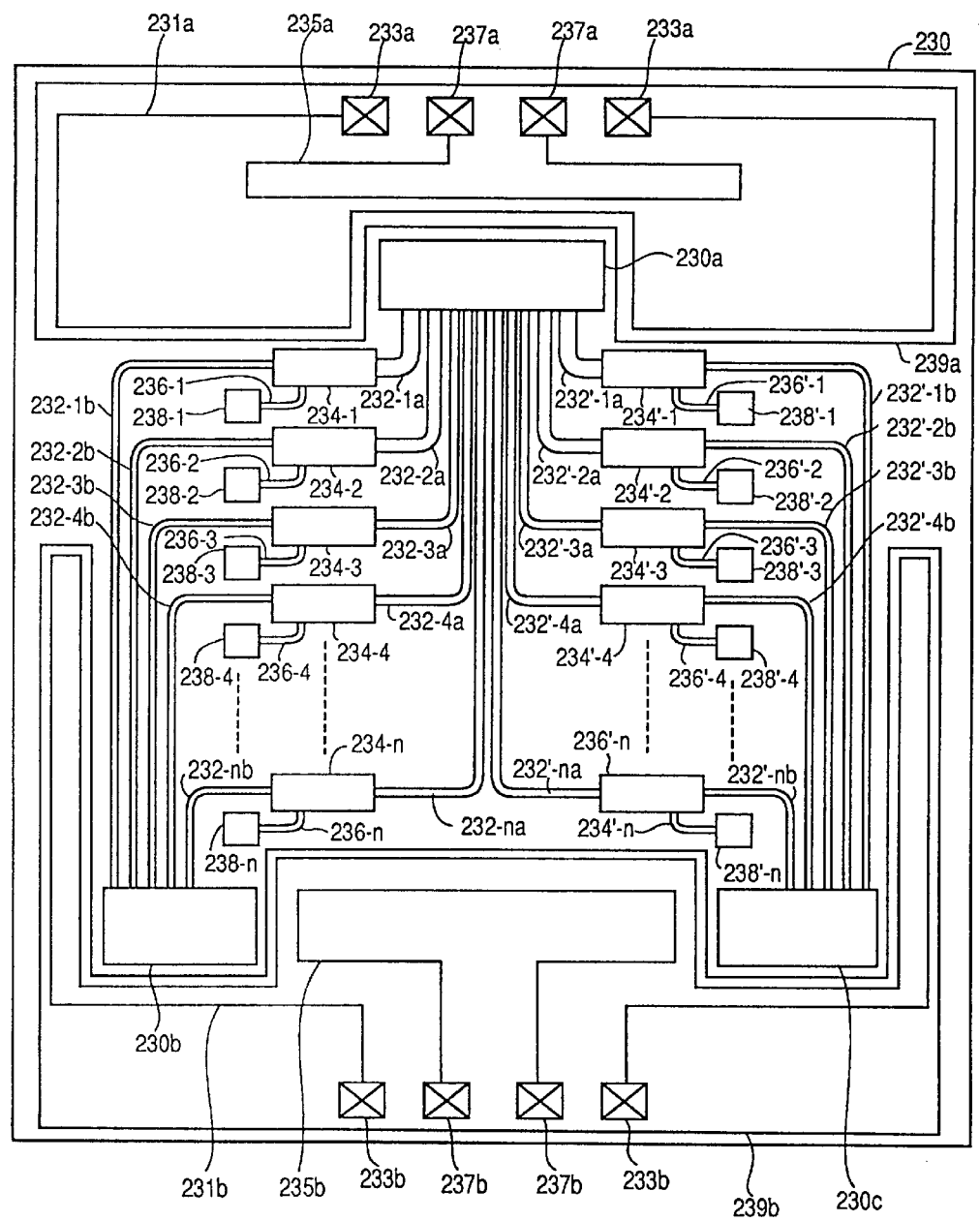
FIG. 30 is a schematic diagram showing another embodiment of the apparatus for crystal growth according to the present invention.

FIG. 30 shows another embodiment of the apparatus according to the present invention. An apparatus 230 for crystal growth has solution cells 230a, 230b and 230c corresponding to the first liquid storage part arranged with an appropriate interval. Reaction cells 234-1, 234-2, 234-3, 234-4, . . . 234-n corresponding to the second liquid storage part are provided to receive the solution supplied from respective solution cells 230a and 230b. Reaction cells 234'-1, 234'-2, 234'-3, 234'-4, . . . 234'-n corresponding to the second liquid storage part are provided to receive the solution supplied from respective solution cells 230a and 230c. Passages 232-1a–232-na and 232'-1a–232'-na extend from solution cell 230a to each reaction cell. Passages 232-1b–232-nb extend from solution cell 230b to each reaction cell. Passages 232'-1b–232'-nb extend from solution cell 230c to each reaction cell. As shown in the figure, the passages, which are connected to respective reaction cells and have different lengths and widths can provide different flow rates of solution from the solution cells to the reaction cells. Therefore, liquid mixtures of different concentrations can be obtained in the respective reaction cells. Additionally, drain cells 238-1–238-n and 238'-1 –238'-n are provided corresponding to the respective reaction cells in the apparatus. These drain cells and the respective reaction cells are connected by passages 236-1–236-n and 236'-1–236'-n respectively. The reaction cells, drain cells and the passages therebetween may be formed on a doped semiconductor layer. In contrast, the solution cells and the passages between the solution cell and the reaction cell may be formed on a general-purpose material such as glass. On apparatus 230, heating electrodes 231a and 231b and temperature measuring electrodes 235a and 235b are formed at a prescribed pattern. Heating electrodes 231a and 231b are supplied with power via terminals 233a and 233b. Temperature measuring electrodes 235a and 235b are connected to terminals 237a and 237b, respectively, formed on substrate 230. These electrodes and terminals can be easily obtained by forming a patterned thin chromium film, for example, on a substrate formed of an insulative material. Heating electrodes 231a and 231b is energized to heat the apparatus. The drain cells and the passages connecting the drain cells with the reaction cells may also be formed on a general-purpose material such as of glass.

Figure 31:
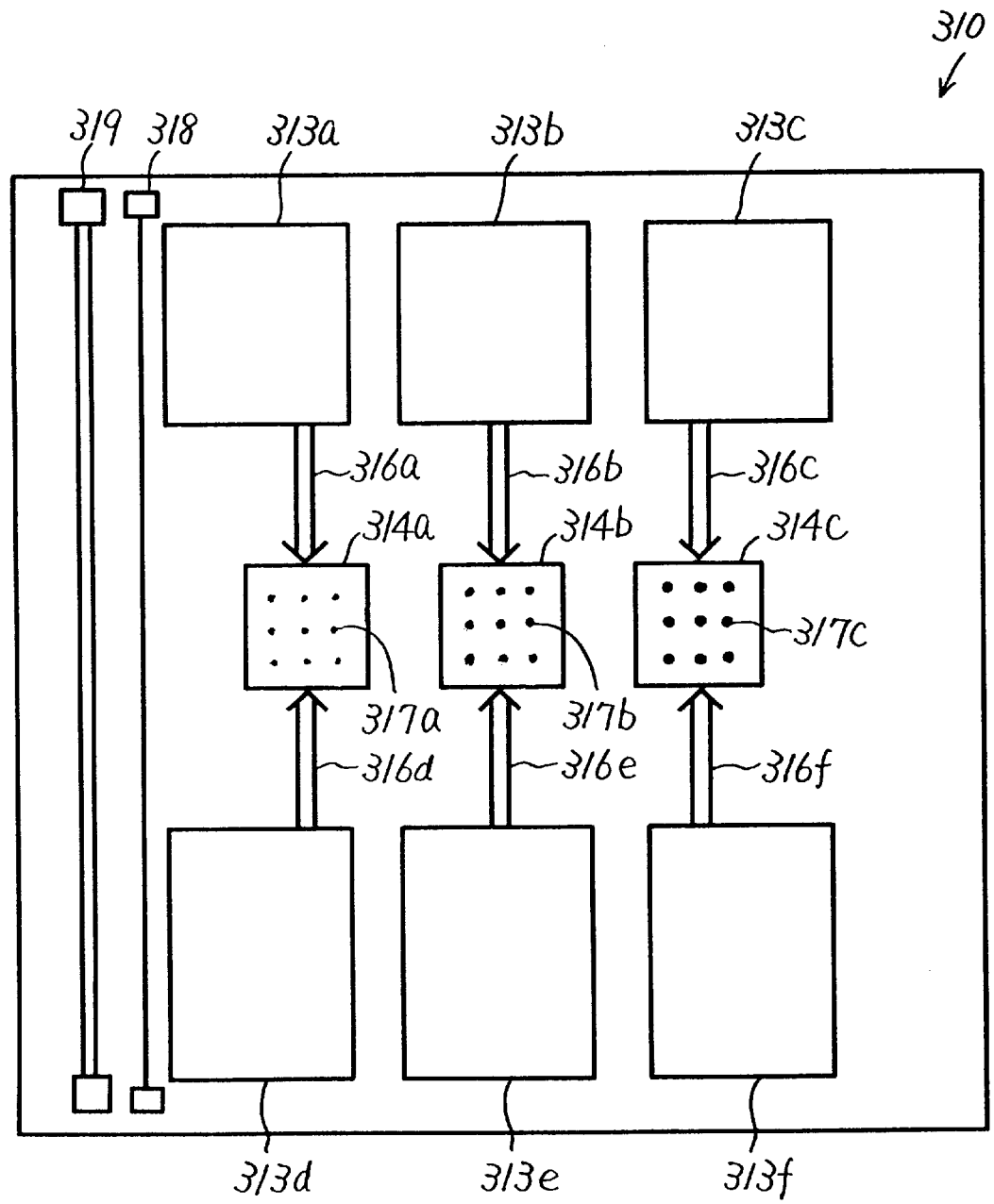
FIG. 31 is a schematic diagram showing another embodiment of the apparatus for crystal growth according to the present invention.
Figure 32:
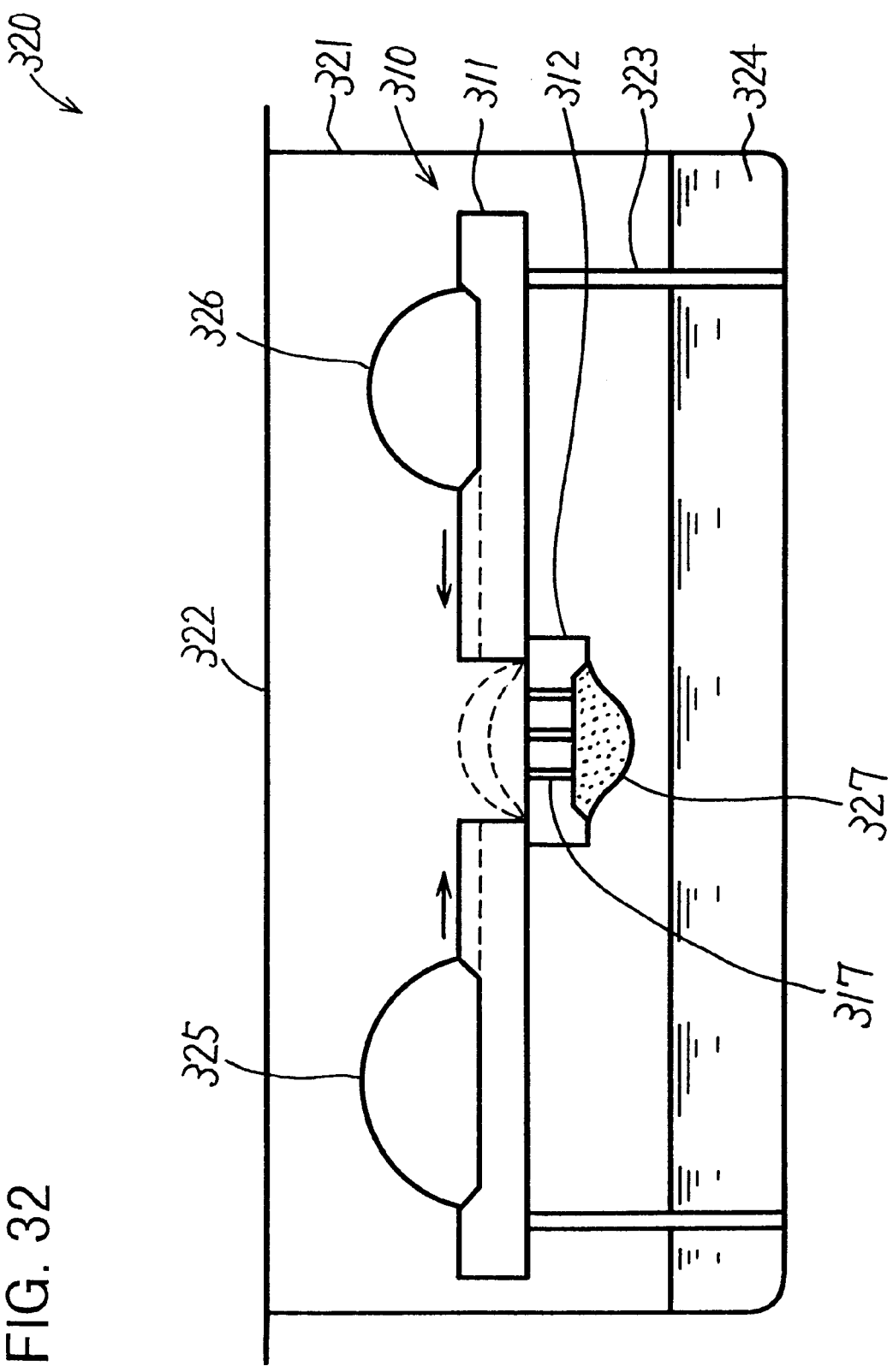
FIG. 32 is a schematic diagram showing a usage of the apparatus of FIG. 30.

According to the present invention, an apparatus as shown in FIG. 31 may be provided. Solution cells 313a, 313b, 313c, 313d, 313e and 313f corresponding to the first liquid storage part and reaction cells 314a, 314b and 314c corresponding to the second liquid storage part are arranged at appropriate positions on the surface of an apparatus 310 for crystal growth. Passages 316a, 316b, 316c, 316d, 316e and 316f are formed between the solution cells and the reaction cells. These passages allow the travel of the solution from the solution cell to the reaction cell. The solution cells may be formed on a glass substrate, while the reaction cells may be formed on a semiconductor substrate. Through holes 317a, 317b and 317c are formed in the substrate where the reaction cells are formed. The size of the through hole formed in each reaction cell differs. Specifically, through hole 317c is largest while through hole 317a is smallest. A heating electrode 319 and a temperature-measuring electrode 318 are provided at an end portion of apparatus 310. Apparatus 310 for crystal growth shown in FIG. 31 is incorporated in an apparatus 320 shown in FIG. 32. Apparatus 310 for crystal growth composed of an upper substrate 311 such as a glass substrate and a lower substrate 312 such as a semiconductor substrate having through holes 317 is housed in a container 321. A solution 324 such as a buffer solution is placed on the bottom of container 321. The opening of container 321 is sealed by a lid 322 to prevent vaporization of the solution. Upper substrate 311 is held horizontally by a support leg 323. A solution to adjust the crystallization conditions such as a buffer solution or a solution containing a substance to be crystallized such as protein is provided in droplets into the solution cells of upper substrate 311. Droplets 325 and 326 held in the respective solution cells partially flow into the reaction cells on lower substrate 312 via respective passages. The introduced solution flows to the liquid storage part formed on the bottom surface of lower substrate 312 via through hole 317. Accordingly, a droplet 327 suspending in the direction of gravity is held in the liquid storage part. The solution is transported by capillarity to be maintained in each reaction cell. Under the circulation of the solution, the desired crystallization and/or reaction can be carried out in the reaction cells.

The through hole may be formed by anisotropic etching, dry etching, or the like. The size of the through hole is important since it has an effect on the synchronized variation of the solution in the reaction cell. In general, the diameter of the through hole is preferably in the range of 1.0 µm to 5 mm, more preferably in the range of 10 µm to 1 mm. Any number of through holes may be provided in the reaction cell.

Figure 33A:
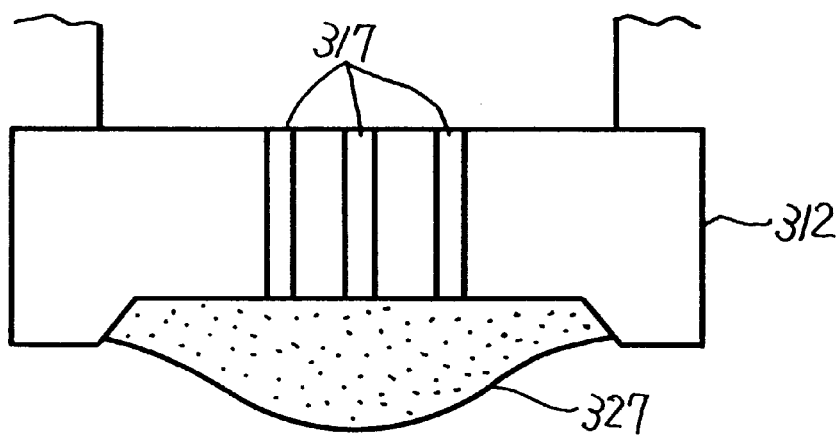
FIGS. 33(a), 33(b), and 33(c) are schematic diagrams showing the manner of liquid moving in a reaction cell in which a through hole is provided in the apparatus of FIG. 32.
Figure 33B:
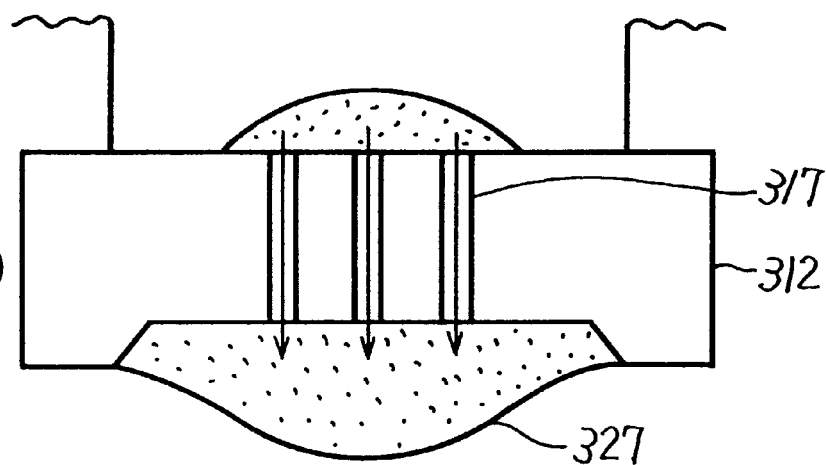
Figure 33C:
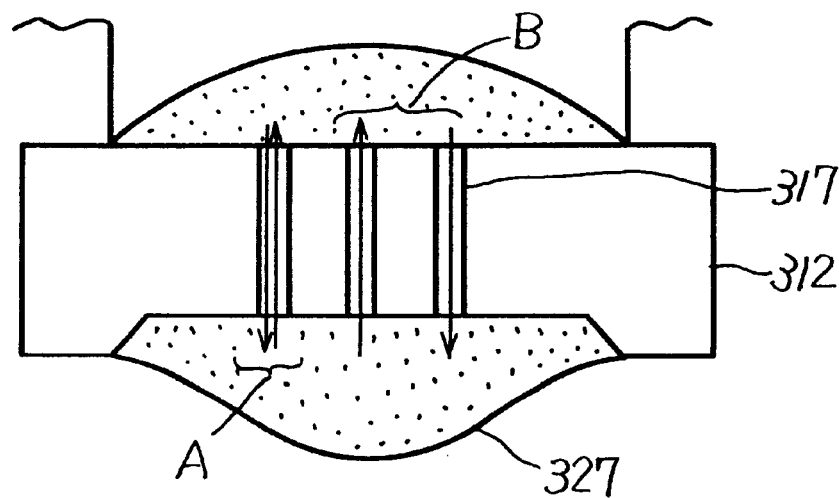

FIGS. 33(a)–33(c) show the mechanism of the upper reaction cell and the lower reaction cell connected by the through hole. As shown in FIG. 33(a), the solution flows into the upper reaction cell formed on the upper surface of lower substrate 312 through the passage. The introduce solution flows down into the lower reaction cell via through hole 317 to be held as droplet 327. As shown in FIG. 33(b), as the solution flows into the upper reaction cell, the solution is gradually gathered also in the upper reaction cell while droplet 327 suspending in the direction of gravity is held in the lower reaction cell. At this time, the flowing direction of the solution is mainly in the direction shown by the arrow. Further flow of the solution into the upper reaction cell may produce liquid flows as shown in FIG. 33(c). If through hole 317 has an appropriate diameter, the upward flow and the downward flow can be generated at the same time in one through hole as indicated by A of FIG. 33(c). Also, flows of opposite directions are synchronously generated in plural through holes, as shown by B in FIG. 33(c). The solution in the reaction cell could seem to attain an equilibrium state. However, the solution held in the reaction cell is not in a thermodynamic equilibrium state, but can be in a biologically "living state" where its flow fluctuates rhythmically due to the non-linear oscillation phenomenon. Such non-equilibrium environment may allow for a continued chemical reaction including crystallization.

Figure 34A:
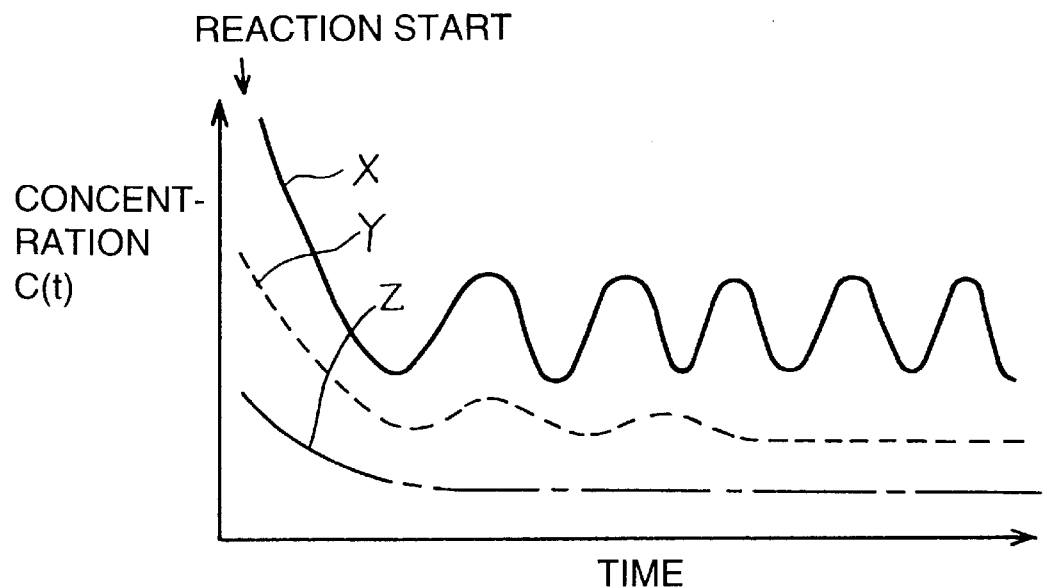
FIGS. 34(a) and 34(b) show the change in the solution concentration in the liquid storage part formed with a through hole.
Figure 34B:
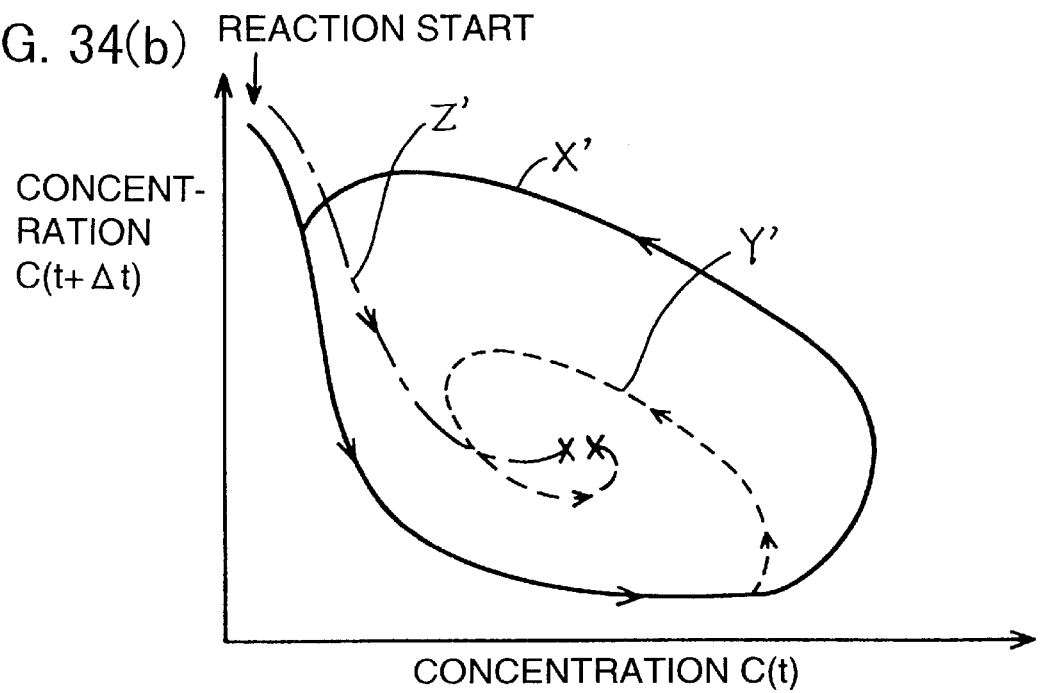

FIG. 34(a) represents the phenomenon of FIGS. 33(a)–33(c) as the change in the solution concentration over time. In FIG. 34(a), time is plotted along the abscissa and the solution concentration is plotted along the ordinate. If solutions are simply mixed in a beaker or the like, the concentration of a certain substance in the beaker gradually decreases to attain a constant value that dose not change afterwards. This process is indicated by curve Z in FIG. 34(a). In the apparatus of the present invention, the change in the substance concentration over time would follow the process represented by curve X or Y in FIG. 34(a) since the flows shown in FIGS. 33(a)–33(c) occur between the reaction cells. In other words, the concentration varies periodically over a long period of time. Such change in concentration may be similar to the phenomenon occurring in various substances in vivo. FIG. 34(b) represents phase orbit curves of the concentration change of FIG. 34(a). Curves X', Y' and Z' of FIG. 34(b) correspond to curves X, Y and Z of FIG. 34(a).

Figure 35:
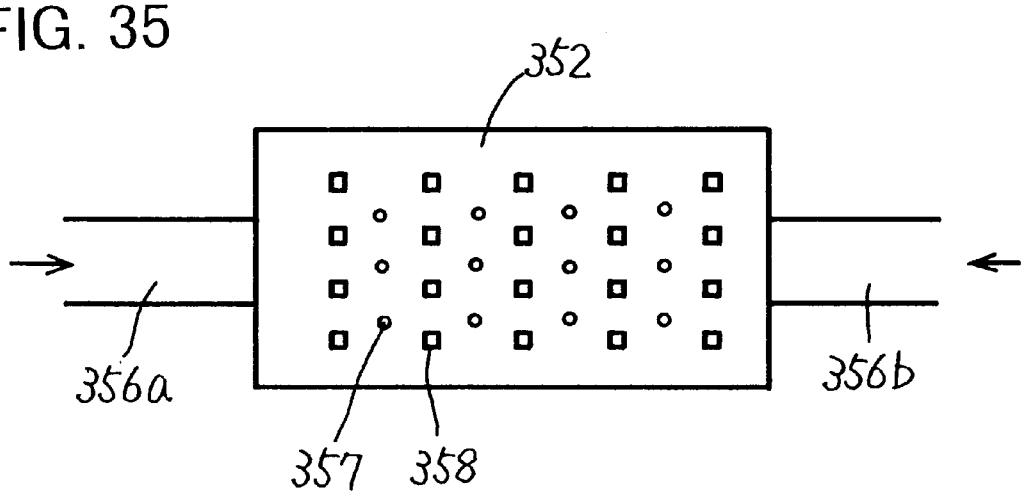
FIG. 35 is a plan view showing a reaction cell provided with through holes and islands.
Figure 36:
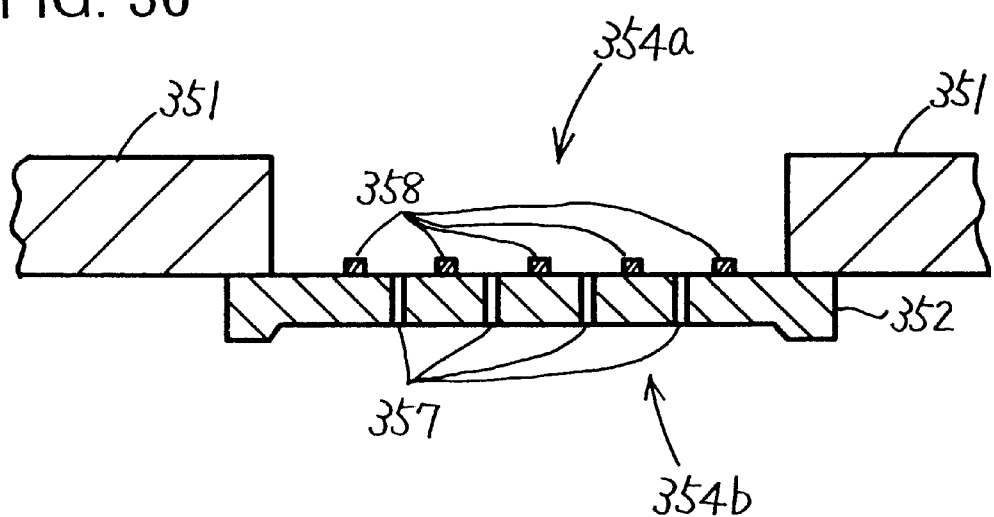
FIG. 36 is a schematic sectional view of the reaction cell of FIG. 35.

As shown in FIGS. 35 and 36, on a silicon substrate 352 having a conductivity type or a resistance, islands of silicon layer 358 having another conductivity type or resistance may be formed with a certain pattern. Through holes 357 are formed in the silicon substrate 352. Upper substrate 351 is bonded to the silicon substrate 352 to form an upper reaction cell 354a. A lower reaction cell 354b is formed at the other side surface of the silicon substrate 352 opposite to upper reaction cell 354a. Liquids for crystallization flow into the silicon substrate 352 via passages 356a and 356b.

N-type or P-type silicon crystal used in the present invention may have similar properties to those of the silicon wafers used in the general LSI process. The specific resistance of the silicon crystal is preferably in the range of about 0.0001 to 1000 Ωcm, more preferably in the range of 0.001 to 100 Ωcm. Various methods may be used for preparing silicon whose valence electrons are controlled to N-type or P-type. Although not limited, ion implantation may be used as a most convenient method for accurately controlling the impurity concentration. In this method, the P-type or N-type valence electron control can be easily carried out by implanting ions of the element from Group III or Group V of the periodic table into silicon and by carrying out annealing. The Group III elements for the P-type include B, Al, Ga, In, Tl and the like. B is typically used. The Group V elements for the N-type include N, P, As, Sb, Bi and the like. P, As or Sb is typically used. As in the case of a conventional wafer, the surface of the crystal is preferably mirror-polished for controlling the deposition of crystal nuclei and suppressing deposition of excessive nuclei.

When a thin semiconductor film as shown in FIGS. 20(a)–20(c) is to be employed for the silicon layer in the reaction cell, polycrystalline silicon or amorphous silicon may be deposited on the surface of an electrically insulative substrate such as a glass substrate by chemical vapor deposition (CVD), plasma CVD or the like. In this case, the specific resistance of the semiconductor layer is preferably in the range of about 10 to $10^6$ Ωcm, more preferably in the range of 1 to 10000 Ωcm.

When an impurity layer is to be formed on the surface of a semiconductor substrate or semiconductor layer of silicon or the like, the thickness of the impurity layer is preferably in the range of 0.1 to 200 µm, more preferably in the range of 0.1 to 50 µm. A thickness outside this range might give a difficulty of fabrication process or unfavorable result.

The above embodiments described in detail employ a semiconductor silicon crystal that is readily available for valence electron control. In order to achieve the object of the present invention, however, other materials having a similar function and being stable in the solution for crystallization may also be used conveniently. For example, a simple or a compound semiconductor crystal other than silicon may be used preferably. Moreover, a material other than semiconductor such as an inorganic compound, an organic compound, a macromolecular polymer or a complex thereof whose charge distribution or dielectric constant is controlled may be used.

In the apparatus according to the present invention, the size of the liquid storage part may be determined depending upon the amount of the mother liquor used for crystallization. In general, the size of the liquid storage part may be in the range of 0.1 mm square to 10 mm square. The depth of the liquid storage part may be in the range of 0.01 to 500 µm. Etching the substrate at a certain area and depth in the aforementioned range will give an appropriate liquid storage part.

In the apparatus according to the present invention, the passage may be formed by etching the substrate directly, or by etching a film formed on the surface of the substrate, such as an insulative film, a silicon oxide film or the like. One groove forming the passage has a width preferably in the range of 0.01 to 10000 µm, a length preferably in the range of 0.1 to 100 mm, and a depth preferably in the range of 0.01 to 200 µm. The passage may also be formed of a plurality of grooves. In this case, the distance between the grooves is preferably in the range of 0.01 to 10000 µm, and the width of the entire passage formed by the grooves is preferably in the range of 1 µm to 10 mm.

A water-repellent layer may be formed to surround the liquid storage part and/or passage at the surface of the apparatus of the present invention. This layer should be effective for storing the droplet for crystallization in the storage part and/or passage and for preventing the droplet from flowing out to the surrounding. For example, the silicon surface where the surface oxide film is removed may be sufficiently water-repellent with respect to water including only acid or alkali, or pure water. However, the water-repellent property of such surface may be reduced with respect to a solution including salt such as a buffer solution. When a buffer solution is used for crystallization, therefore, it is preferable to form a layer of a water-repellent substance on the peripheral portion of the silicon substrate. For example, the water-repellent layer may be formed of an organic resin. Organic resist materials and polyimide resins are preferable to form the water-repellent layer. When polyimide is used to form the water-repellent layer, a coat of light-sensitive or insensitive polyimide resin is prepared and cured, and then unnecessary portions are removed by etching or development to obtain a desired pattern. Although the thickness of the water-repellent layer is not particularly limited from the standpoint of function, a thickness in the range of 0.1 to 100 µm is relatively easy to produce. Other materials may also be employed as long as they have water-repellent property and are chemically stable in the solution.

The apparatus of the present invention may equip a heating electrode and a temperature-measuring electrode in order to provide temperature gradient and promote crystallization. These electrodes are readily prepared by patterning a thin film of a resistive metal material. The thin film may be prepared by vapor-depositing Cr, Ti, NiCr alloy or the like on the substrate by sputtering, and patterning the obtained thin film. When a silicon substrate is to be heated by the electrode, the heating temperature range is preferably 30 to 100° C., more preferably 40 to 80° C., in the proximity of the heater.

In the apparatus of the present invention, an electrode may be provided to apply voltage to the material whose valence electrons are controlled. For the purpose of promoting crystal growth at the liquid storage part (second liquid storage part) for crystallization, a bias voltage may be applied to increase the surface potential of that part.

Example

Sperm whale-derived myoglobin was dissolved in a concentration of 20 mg/ml in a phosphoric acid buffer solution of pH 7.2 to obtain a mother liquor. Two types of apparatuses for crystal growth were prepared as set forth in the following.

(1) Apparatus-1 for crystal growth

A P-type silicon layer of low resistance (specific resistance: about 0.01 Ωcm, impurity layer depth: about 1 µm) was formed all over the surface of an N-type silicon substrate having a specific resistance of about 20 Ωcm by ion-implantation of boron and annealing. Then, a silicon oxide layer was formed to a thickness of 200 nm at the surface by thermal oxidation. Using a photolithography process and etching technique employed generally in the fabrication process of an LSI, the surface of the silicon oxide layer was etched to form a pattern of 100 µm square at an interval of 200 µm all over the surface. Then, using the pattern of the silicon oxide layer as a mask, anisotropic etching was carried out with alkali to remove the silicon to a depth of about 1.5 µm. Then, the silicon oxide layer was removed. The above process gave a structure in which P-type silicon regions of 100 µm square were arranged at an interval of 200 µm on the surface of the N-type silicon substrate. Then, this structure was cut into pieces of 5 mm square to be employed as the lower substrate for the crystal growth apparatus.

In order to obtain an upper substrate for the crystal growth apparatus, a Pyrex glass substrate of 25 mm square having a thickness of 1 mm was prepared. According to the steps shown in FIGS. 14(a)–14(f), a patterned protection film was formed and etched to obtain through holes, dents, and grooves. The size of the two formed dents was 5 mm in vertical length, 15 mm in horizontal length, and 100 µm in depth. The grooves had a width of 100 µm and a length of 5 mm. A through hole of 4 mm square was formed at the center of the Pyrex glass substrate. The obtained upper substrate and the lower substrate were combined by the anodic bonding method.

Figure 37A:
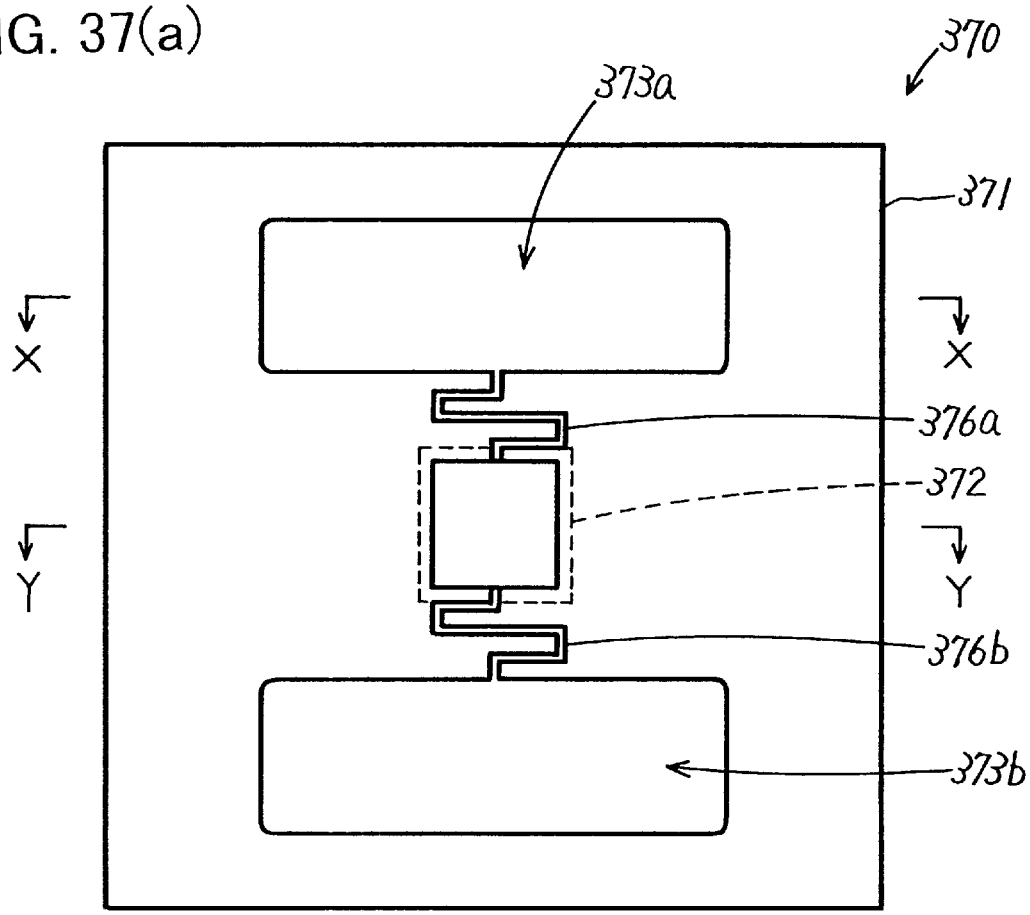
FIGS. 37(a), 37(b) and 37(c) are a plan view, a sectional view taken along X—X, and a sectional view taken along Y—Y, respectively, of an apparatus for crystal growth produced as an embodiment.
Figure 37B:
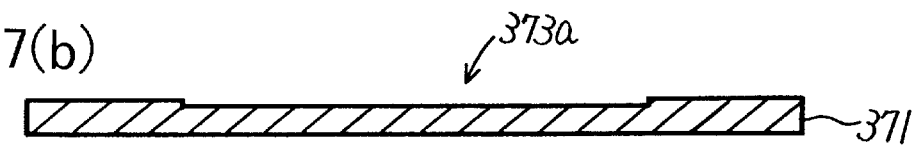
Figure 37C:
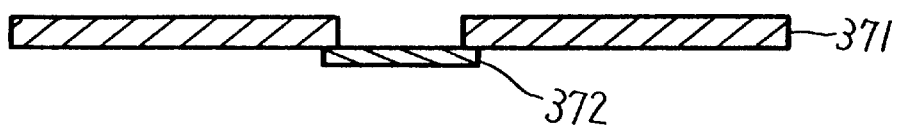

The structure of the obtained apparatus is shown in FIGS. 37(a)–37(c). Liquid storage parts 373a and 373b having a size of 5 mm×15 mm and passages 376a and 376b of 100 µm in width and 5 mm in length were formed on upper substrate 371 of pyrex glass. Lower substrate 372 was bonded to upper substrate 371 to block the through hole formed at the center of upper substrate 371. P-type silicon regions of 100 µm square were arranged at an interval of 200 µm on the surface of lower substrate 372. The surface where these P-type silicon regions are formed functions as the liquid storage part for crystal growth.

(2) Apparatus-2 for crystal growth

A crystal growth apparatus as shown in FIGS. 20(a)–20(c) was prepared. According to the steps shown in FIGS. 23(a)–23(f), an upper substrate made of Pyrex glass having dents, grooves and through holes was prepared by a process similar to that of crystal growth apparatus-1. Then, N-type amorphous silicon (specific resistance: $10^4$ Ωcm) was deposited to a thickness of 2 µm by plasma CVD on the Pyrex glass. Then, P-type amorphous silicon (specific resistance: $10^3$ Ωcm) was deposited to a thickness of 1 µm thereon. Etching was carried out according to the steps shown in FIGS. 21(a)–21(d). A pattern was formed in which islands of 100 µm square and 1.5 µm in height were arranged at an interval of 200 µm on the N-type amorphous silicon layer. The P-type amorphous silicon layer is present on the top of each island. The above steps gave a lower substrate in which the silicon layer is formed on the Pyrex glass substrate. Then, according to the steps shown in FIGS. 24(a) and 24(b), the upper substrate and the lower substrate were combined by the anodic bonding method to obtain the apparatus shown in FIGS. 20(a)–20(c).

Figure 38:
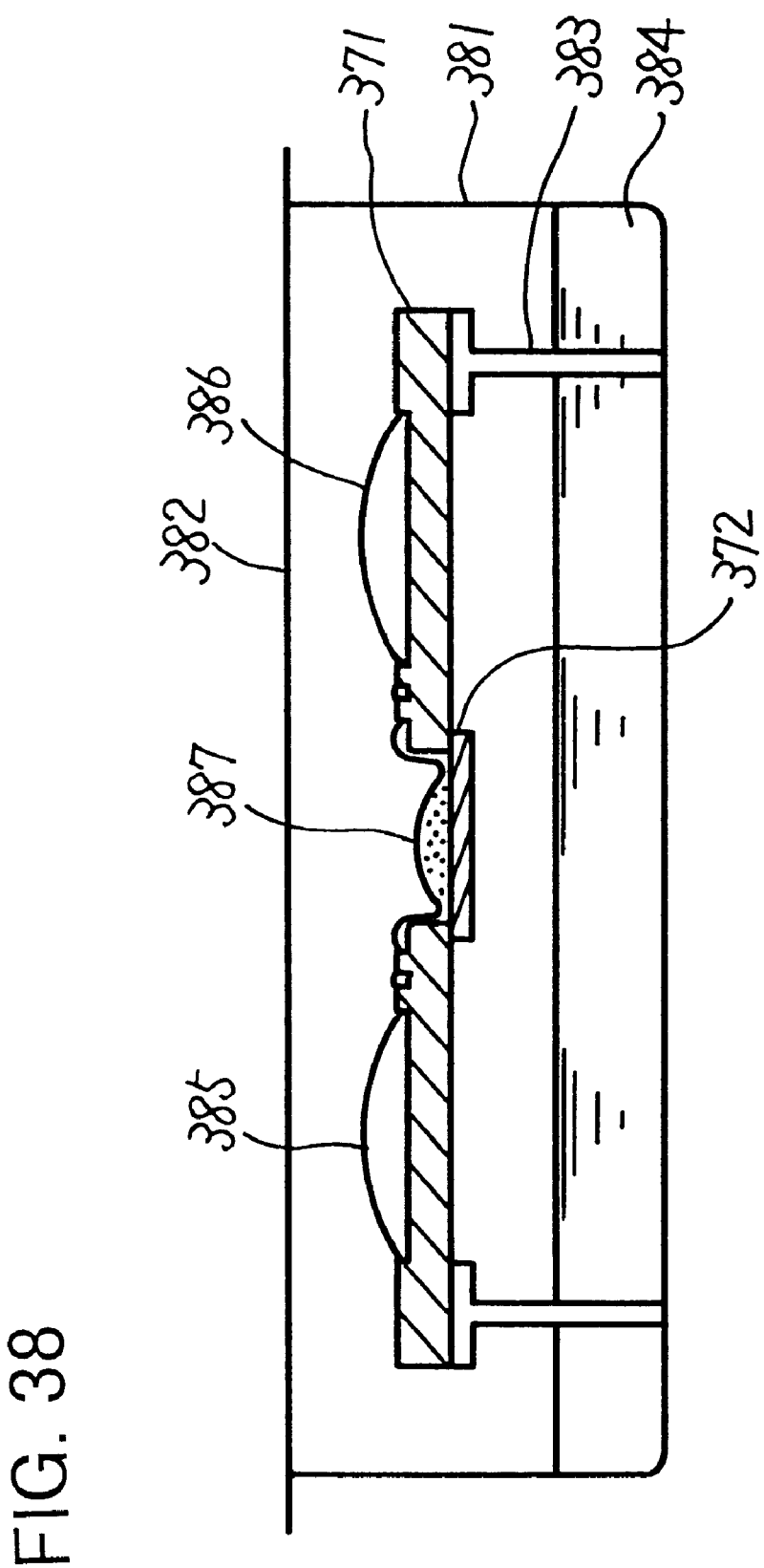
FIG. 38 is a schematic diagram showing the manner of crystal growth using the apparatus of FIGS. 37(a), 37(b), and 37(c).
Figure 39:
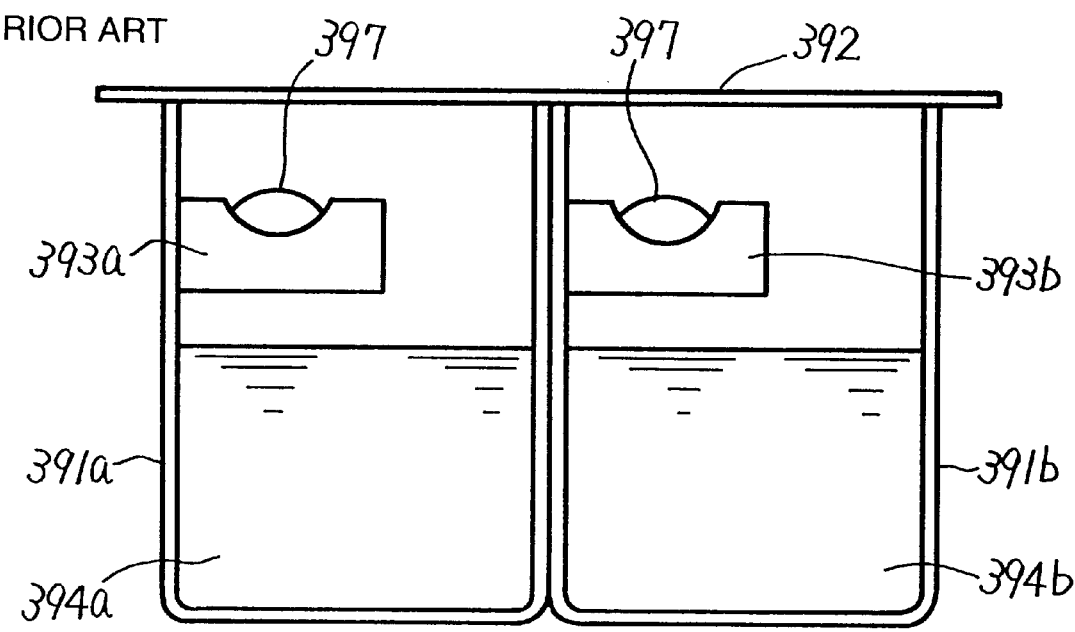
FIG. 39 is a schematic diagram showing an embodiment of the apparatus used in the conventional method.
Figure 40A:
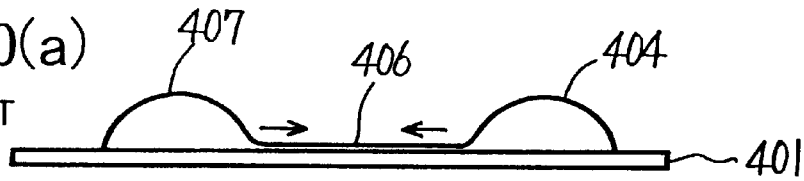
Figure 40B:
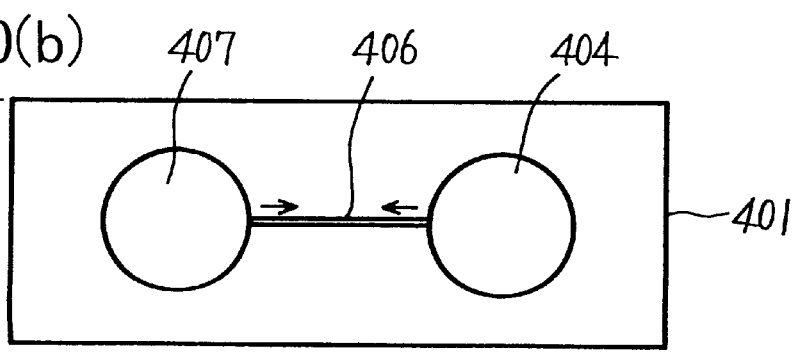

Crystal growth apparatuses-1 and 2 were held horizontally in a container. 200 µm droplets of the myoglobin solution were placed on the liquid storage part at the center of each apparatus. About 1 ml of a buffer solution of pH 7.2 was provided in droplets to one of the other liquid storage parts in the upper substrate, while about 1 ml of 0.2 M aqueous sodium chloride solution (precipitant) was provided in droplets into the other liquid storage part. Then, about 5 ml of a buffer solution of pH 7.2 was provided in droplets at the bottom of the container in which the apparatus for crystal growth was housed. The container was covered with a lid and allowed to stand in a cool and dark place of 10° C. FIG. 38 shows the manner of the container placed in the cool and dark place. The crystal growth apparatus composed of the upper substrate 371 and the lower substrate 372 were maintained horizontally by a support member 383 in the container 381. The container 381 was sealed by a lid 382. Buffer solution 384 was stored at the bottom of the container. Buffer solution 385 and precipitant 386 were retained in the two liquid storage parts, respectively, of the upper substrate 371. Myoglobin solution 387 was retained in the center liquid storage part. Crystal growth apparatus-2 was held in a container in a similar manner.

Crystal growth apparatuses-1 and 2 holding the liquids for crystallization were allowed to stand for 48 hours in the cool and dark place. The sample was then taken out from the center liquid storage part to be observed for crystallization of myoglobin using a microscope. In crystal growth apparatus-1, three single crystals of a large size of about 0.9 mm with a smooth surface were obtained, and no twin or microcrystals were generated. In crystal growth apparatus-2, six single crystals of a middle size of about 0.5 mm with a smooth surface were obtained, and no twin or microcrystals were generated. The result has shown that a large single crystal of good quality can be obtained with a small amount of sample in the apparatus for crystal growth according to the present invention.

As described above, the present invention can overcome the disadvantages of the conventional crystallization process that has been carried out by repeating trial and error. Particularly according to the present invention, the influence of convection in the solution caused by gravity can be suppressed to effect stable formation of a nucleus at the initial stage of crystallization. According to the present invention, mass production of micro crystals can be suppressed or controlled to allow a large-sized crystal to be formed enabling X-ray structural analysis. According to the present invention, different conditions for crystallization can be prepared with a small amount of solution in a single apparatus. Accordingly, optimum conditions for crystallization can be produced for a specific molecule. According to the present invention, influence of the convection in the solution can also be suppressed for stable crystal growth. The present invention can produce more appropriate conditions in a short period of time to grow a large crystal even with a small amount of sample.

The present invention may be used to crystallize various macromolecules, particularly macromolecular electrolytes. The present invention is preferably applicable to crystallize proteins such as enzymes and membrane proteins, polypeptides, peptides, polysaccharides, nucleic acids, and complexes and derivatives thereof or the like. The present invention is preferably applicable to crystallization of a biological macromolecule. Also, the present invention is applicable to a micro reactor apparatus that supplements, generates, or synthesizes various biological macromolecules such as proteins, enzymes, nucleic acids in vivo or ex vivo. The apparatus of the present invention can be prepared in a micro-structured and integrated manner by the above-described technique. The present invention can provide an economic apparatus for crystal growth combining a material whose valence electrons are controlled and a general-purpose material having a high flexibility of shape, structure, or the like.

The present invention can be applied to research, development and production of useful substances, particularly biological macromolecules such as proteins, nucleic acids and the like in pharmaceutical industry, food industry and the like. According to the present invention, a crystal having good crystallinity enabling X-ray structural analysis can be grown. Information obtained as to the molecular structure and the mechanism of activity as a result of the crystal analysis is applicable to the design and preparation of medicines. The present invention is also applicable to purification and crystallization of molecules of interest. In addition, the present invention could be used for the preparation of an electronic device employing biological macromolecules such as proteins. The apparatus of the present invention can allow selective adsorption and fixation of biological macromolecules or the like, and, therefore, could be applied to biosensors, or measuring devices which determine various biological tissues and biological substances by a biosensor. Although the present application has been described and illustrated in detail, from the foregoing description, one skilled in the art can easily ascertain the essential characteristics of the present application and various changes and modifications may be made to adapt the various uses and characteristics without departing from the spirit and scope of the present application, as described by the claims which follow.

What is claimed is:

1. An apparatus for growing a crystal of a macromolecule contained in a solution, comprising:
    a first rigid substrate which has a first liquid storage part in a surface of the substrate for holding a liquid to be used for crystal growth;
    a second rigid substrate which is bonded to the first substrate and on which a second liquid storage part for receiving the liquid from the first substrate is formed; and
    a passage which connects the first liquid storage part to the second liquid storage part, wherein
        the first substrate is made of a first material and at least a portion of the second liquid storage part is made of a second material which is different from the first material; and
        the surface of the portion of second liquid storage part has different regions which have different surface potentials.

2. The apparatus according to claim 1, wherein the first substrate has a hole into which the liquid held in the first liquid storage part can flow through the passage, and
    the second substrate is provided at a bottom of the hole to form the second liquid storage part by the hole and the second substrate.

3. The apparatus according to claim 1, wherein the surface of the second liquid storage part has different regions which have different surface potentials so that crystal nucleus formation and crystal growth of the macromolecule are facilitated at a specific region of the different regions while crystal nucleus formation is suppressed at the remaining region.

4. The apparatus according to claim 1, wherein the second substrate is a semiconductor substrate.

5. The apparatus according to claim 4, wherein the first substrate consists essentially of an electrically insulative material.

6. The apparatus according to claim 4, wherein
    the semiconductor substrate is a silicon substrate which has a surface portion doped with an impurity, and
    the concentration and/or type of the impurity varies over the surface portion so that the surface portion has the different regions which have the different surface potentials.

7. The apparatus according to claim 1, wherein the second substrate comprises:
- a base substrate made of an electrically insulative material; and
- a semiconductor layer made of the second material and formed on the base substrate.

8. The apparatus according to claim 7, wherein the first substrate consists essentially of an electrically insulative material.

9. The apparatus according to claim 7, wherein the semiconductor layer is a silicon layer doped with an impurity, and
- the concentration and/or type of the impurity varies over the silicon layer so that the silicon layer has the different regions which have the different surface potentials.

10. The apparatus according to claim 1, wherein the passage is a groove formed on the surface of the first substrate.

11. The apparatus according to claim 1, including providing a plurality of the first liquid storage parts in the surface of the first substrate.

12. The apparatus according to claim 11, wherein a plurality of the passages are provided, and
- the second liquid storage is connected to each of the first liquid storage parts via each of the passages for receiving the liquid to be used for crystal growth from each of the first liquid storage parts.

13. The apparatus according to claim 1, wherein the first liquid storage part is a dent formed on the surface of the first substrate.

* * * * *